United States Patent
Gruber et al.

(10) Patent No.: US 11,128,068 B2
(45) Date of Patent: Sep. 21, 2021

(54) CIRCUIT BOARD ARRANGEMENT, CONNECTION ELEMENT AND METHOD FOR ASSEMBLING AT LEAST ONE CONNECTION ELEMENT

(71) Applicant: Rosenberger Hochfrequenztechnik GmbH & Co. KG, Fridolfing (DE)

(72) Inventors: Andreas Gruber, Ainring (DE); Tobias-Lars Hoeher, Waging am See (DE); Tobias Stadler, Fridolfing (DE)

(73) Assignee: ROSENBERGER HOCHFREQUENZTECHNIK GMBH & CO. KG, Fridolfing (DE)

( * ) Notice: Subject to any disclaimer, the term of this patent is extended or adjusted under 35 U.S.C. 154(b) by 0 days.

(21) Appl. No.: 16/771,076

(22) PCT Filed: Oct. 30, 2018

(86) PCT No.: PCT/EP2018/079641
§ 371 (c)(1),
(2) Date: Jun. 9, 2020

(87) PCT Pub. No.: WO2019/120715
PCT Pub. Date: Jun. 27, 2019

(65) Prior Publication Data
US 2021/0194159 A1    Jun. 24, 2021

(30) Foreign Application Priority Data

Dec. 21, 2017 (DE) .................... 10 2017 130 967.5
Jan. 11, 2018 (DE) .................... 10 2018 100 557.1

(51) Int. Cl.
*H01R 11/22* (2006.01)
*H01R 12/52* (2011.01)
(Continued)

(52) U.S. Cl.
CPC ......... *H01R 12/52* (2013.01); *H01R 12/7047* (2013.01); *H01R 12/7082* (2013.01); *H01R 12/724* (2013.01); *H01R 43/205* (2013.01)

(58) Field of Classification Search
CPC .. H01R 12/52; H01R 12/523; H01R 12/7047; H01R 12/7082; H01R 12/724; H01R 43/205
(Continued)

(56) References Cited

U.S. PATENT DOCUMENTS

| 5,345,366 A | 9/1994 | Cheng et al. |
| 5,380,211 A | 1/1995 | Kawaguchi et al. |

(Continued)

FOREIGN PATENT DOCUMENTS

| DE | 102014208101 | 10/2015 |
| DE | 102017002307 | 9/2018 |

(Continued)

OTHER PUBLICATIONS

International Search Report with Written opinion of the international searching authority, PCT/EP2018/079641, dated Feb. 1, 2019.
(Continued)

*Primary Examiner* — Khiem M Nguyen
(74) *Attorney, Agent, or Firm* — Randall Danskin, P.S.

(57) ABSTRACT

A circuit board arrangement, and method for assembling at least one connection element, provides a first circuit board and a second circuit board arranged in a parallel orientation to one another in different planes, and at least one rigid connection element communicates between the first and the second circuit boards and the connection element has an exterior housing which encloses an internal conductor part, and the exterior housing constitutes a first electrical path between the first and second circuit boards, and the internal conductor part constitutes a second electrical path between the first and second circuit boards.

23 Claims, 15 Drawing Sheets

(51) Int. Cl.
*H01R 43/20* (2006.01)
*H01R 12/70* (2011.01)
*H01R 12/72* (2011.01)

(58) Field of Classification Search
USPC .......................................... 439/55, 66, 816
See application file for complete search history.

(56) References Cited

U.S. PATENT DOCUMENTS

| 2014/0329421 A1 | 11/2014 | Tatzel et al. |
| 2015/0144376 A1 | 5/2015 | Taketani |
| 2016/0079693 A1 | 3/2016 | Wu et al. |

FOREIGN PATENT DOCUMENTS

| GB | 2288492 | 10/1995 |
| WO | 2009008741 | 1/2009 |
| WO | 2010130655 | 11/2010 |
| WO | 2015165946 | 11/2015 |
| WO | 2018162098 | 9/2018 |

OTHER PUBLICATIONS

German Search Report dated Nov. 9, 2018.
PCT Request, PCT/EP2018/079641, dated Nov. 15, 2018.
International Bureau forms, PCT/EP2018/079641.

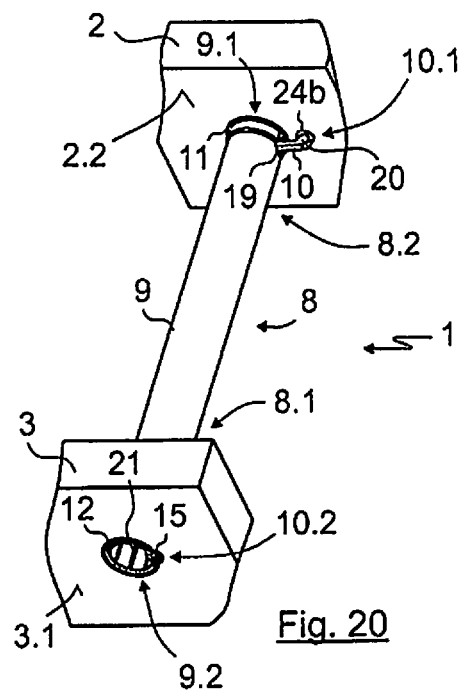
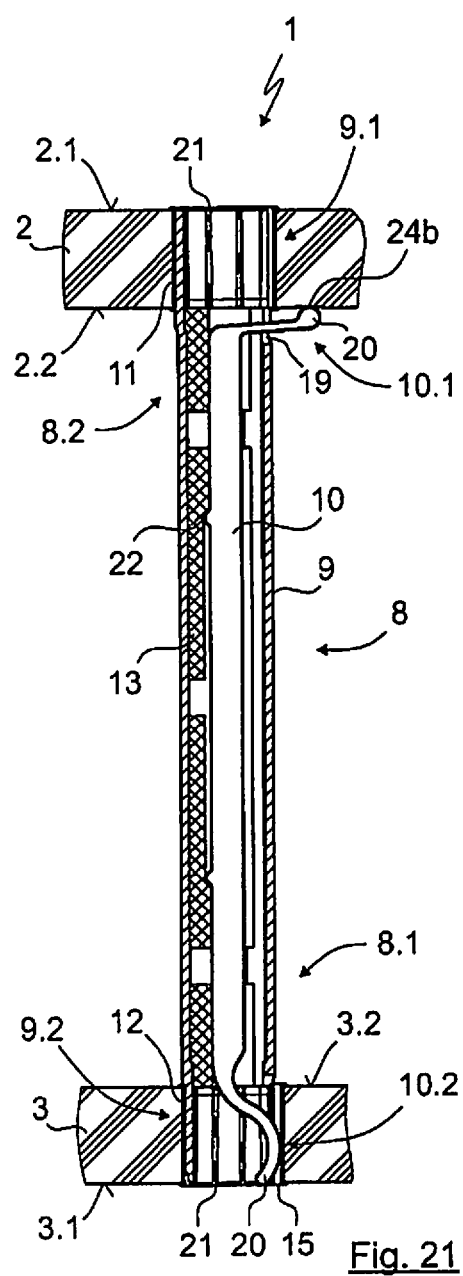

CIRCUIT BOARD ARRANGEMENT, CONNECTION ELEMENT AND METHOD FOR ASSEMBLING AT LEAST ONE CONNECTION ELEMENT

RELATED APPLICATIONS

This US National Phase patent application claims priority to German Patent Application No. 10 2017 130 967.5 which was filed on 21 Dec. 2017, and also claims priority to German Patent Application No. 10 2018 100 557.1 which was filed on 11 Jan. 2018, and also claims priority to PCT/EP2018/079641 which was filed on 30 Oct. 2018 and which was published as WO 2019/1210715 A1 on 27 Jun. 2019. The entire contents of each of the aforementioned Patent Applications is expressly and fully incorporated herein by this reference.

BACKGROUND

The invention relates to a circuit board arrangement, comprising at least one first circuit board and a second circuit board.

The invention further relates to a connection element for a circuit board arrangement.

The invention moreover relates to a method for assembling at least one connection element in a preassembled circuit board arrangement.

A generic circuit board arrangement is described in U.S. Pat. No. 5,380,211.

Electrical assemblies generally feature electronic circuits, which are implemented on circuit boards (printed circuit boards, PCBs) by the interconnection of a plurality of electronic components. In many cases, a plurality of circuit boards are provided in an assembly, in order to distribute a circuit, for example spatially, within a housing or an enclosure, or to interconnect various modules in an assembly. In general, according to this design, an electrical connection between the different circuit boards is required for the exchange of signals and/or energy. An electrical connection between different circuit boards can also be required, for example, if a plurality of electronic assemblies are to be communicatively interconnected. Overall, there are many reasons for the interconnection of electric circuit boards.

For the electrical connection of circuit boards, various options are known, including unshielded plug connectors, stranded wires and ribbon cables. Connectors of this type are also described by the term "board-to-board" connectors. In general, however, conventional connections are inadequate in particular for high-frequency engineering.

For the transmission of signals in high-frequency engineering, coaxial plug connections are commonly employed for the electrical interconnection of two circuit boards, in order to ensure a sufficiently high signal quality. In practice, one coaxial plug connector respectively is connected to the strip conductors of the circuit boards by means of a soldering process. A coaxial adaptor then connects the two coaxial plug connectors, and thus bridges the gap between the two circuit boards, in order to permit the exchange of signals. A circuit board arrangement of this type, for example, is also described in the generic U.S. Pat. No. 5,380,211, which concerns an electrical plug connector, and in particular a coaxial plug connector for the electrical connection of two circuit boards arranged in parallel. Comparable connection elements are for example also known from US 2015/0144376 A1 or from WO 2009/008741 A1.

One disadvantage of known plug connectors for connecting electric circuit boards, however, is that they cannot, without further measures, be integrated by retrofitting in an existing or preassembled circuit board arrangement. This applies particularly if the circuit boards to be connected are already accommodated in an independent carrier structure and are positioned relative to one another and/or are accommodated in one or a plurality of enclosures. In known plug connectors, it is therefore generally necessary for the circuit board assembly to be constituted in the form of a sandwich construction, i.e. the plug connector must firstly be connected to one of the circuit boards, and only then is the second circuit board fitted thereupon. In particular in the light of the increasing bandwidth of data transmission and the progressive miniaturization of electronic assemblies, this concept is technically disadvantageous, and is also inflexible for the purposes of installation.

By way of further general background reference, reference is made to WO 2010/130655 A1, which relates to an arrangement for the electrical and mechanical interconnection of two circuit boards. GB 2 288 492 A further relates to an addressing module which is connectable to a circuit board and has elongated contacts, and US 2016/0079693 A1 relates to a plug connector which is arranged on a circuit board.

An object of the present invention is therefore the simplification of the layout of a circuit board arrangement.

An object of the present invention is also the provision of a connection element for a circuit board arrangement, which is connectable to a circuit board arrangement in a particularly simple manner.

A further object of the invention is the provision of a simple method for the fitting of at least one connection element in a preassembled circuit board arrangement.

The circuit board arrangement according to the invention comprises at least one first circuit board and a second circuit board, wherein the circuit boards are arranged in a parallel orientation with one another in different planes.

In particular, the surfaces of circuit boards which can be populated with electrical components are oriented in parallel with one another.

The circuit board arrangement can comprise any number of circuit boards, but a minimum of two. Even though the invention is described hereinafter for illustrative purposes essentially with respect to the connection of two electrical circuit boards, the circuit board arrangement can, for example, also comprise three circuit boards, four circuit boards, five circuit boards or even more circuit boards.

Preferably, the circuit boards which are to be interconnected are arranged in parallel with one another in different planes. In the present case, the term "parallel" is understood to include in particular a tolerance-related deviation from the parallel arrangement, for example of up to 10°, preferably of up to 5°, and particularly preferably of up to 3°.

The circuit boards can be arranged in direct contact with one another, or preferably spaced from one another, and can in particular have a gap constituted there-between.

The circuit boards are preferably congruently arranged one on top of the other or one beneath the other, where the circuit boards are of identical dimensions.

According to the invention, the circuit board arrangement further comprises a rigid connection element arranged between the circuit boards, wherein the connection element comprises an exterior housing which encloses an internal conductor part of the connection element.

The exterior housing encloses the internal conductor part, preferably in a tubular manner.

The connection element can preferably be configured coaxially, i.e. such that the longitudinal axes of the internal conductor part and of the exterior housing coincide. This is not absolutely necessary for the purposes of the invention, however.

It is not necessary for the exterior housing to be configured in a completely closed arrangement around the internal conductor part and, within the meaning of the invention, it can also enclose the internal conductor part if it incorporates cutouts, in particular bores and/or slots.

A plurality of internal conductor parts can also be provided within the exterior housing, for example two, three, four, five or even more internal conductor parts. However, it is particularly preferred that only one internal conductor part is employed. In the interests of clearer understanding, the invention is described hereinafter with only a single internal conductor part, although this is not to be understood by way of limitation.

According to the invention, the exterior housing is connected at a first end to the first circuit board and at a second end to the second circuit board in an electrically conductive manner, in order to constitute a first electrical path. The internal conductor part is connected at a first end to the first circuit board and at a second end to the second circuit board in an electrically conductive manner, in order to constitute a second electrical path.

The electrical paths can be respectively employed for the transmission of electrical signals, in particular high-frequency signals, for electrical shielding and/or for electrical energy transmission. For the constitution of the electrical paths, it is not necessary for the exterior housing and the internal conductor part to be configured in an entirely electrically conductive manner; the exterior housing and the internal conductor part can also be configured in only a partially electrically conductive manner, or can incorporate an electrically conductive material, such that the electrical paths are constituted.

According to the invention, it is provided that the first circuit board comprises a first through hole, wherein the first through hole and the connection element are configured such that the connection element is insertable into the first through hole from an outer side of the first circuit board which is averted from the second circuit board, wherein a front end of the connection element which is fed through the first through hole, in a terminal position of the connection element, is contact-connected with the second circuit board and the connection element constitutes the electrical paths.

The front end of the connection element can in particular incorporate the exterior housing and/or the internal conductor part.

The connection element can preferably be configured coaxially.

In the context of the invention, a through hole can also be understood to include a cutout of any geometry, for example a rectangular cutout.

The connection element can be inserted or plugged into an already-preassembled circuit board arrangement according to the invention. To this end, the connection element can, at its front end, firstly be fed through the first through hole, and thereafter through an optionally present interspace between the circuit boards, until the front end reaches the second circuit board.

In particular, it can be provided that the connection element, in its terminal position, engages with a contact region and/or a contact surface of the second circuit board, in order to constitute the electrical paths, wherein the exterior housing and the internal conductor part are electrically contact-connected with the second circuit board, or with the contact region or contact surface thereof, while the latter are simultaneously electrically connected to the first circuit board in the region of a rear end of the connection element, preferably again by contact-connection with a contact region and/or contact surface of the first circuit board. As a result, electrical circuits of the two circuit boards can be advantageously interconnected such that, in particular, said circuits can mutually exchange signals and/or electrical energy.

The connection element can preferably be configured such that high-frequency electrical signals are exchangeable between the electrical circuits of the circuit boards by means of the connection element. The geometrical and/or electrical properties of the exterior housing and/or of the internal conductor part can be configured accordingly.

As the connection element, conversely to known connection elements or plug connectors from the prior art, can also be retrofitted to a circuit board arrangement, assembly is firstly simplified and, secondly, a more compact design of the circuit board arrangement is possible. A subsequent replacement of the connection element, for example in the event of damage or where a change in interconnection is desired, is also possible. It is also possible for an existing electrical assembly to subsequently incorporate additional functionalities or for the functional scope of an electrical assembly to be extended by the insertion of the connection element.

In particular, the insertion of the connection element is both possible and advantageous if the circuit board arrangement, some of the circuit boards, in particular the first and the second circuit board, or all the circuit boards are already accommodated in an enclosure or a housing structure, wherein the latter can comprise an electrically conductive or an electrically insulating enclosure. According to this configuration, it can be provided that the respective enclosure, which encloses the corresponding circuit board, incorporates an access opening, which is preferably arranged coaxially with the through hole of the circuit board which is accommodated in the enclosure, in order to permit the subsequent insertion of the connection element, even in the assembled state.

An enclosure can be configured, for example, as an electrically conductive board having bores for the feedthrough of the connection element and/or as an electrically conductive bush for the feedthrough of the connection element or can incorporate a corresponding board and/or bush.

The enclosure can be employable for the purposes of additional electromagnetic shielding. In particular, if the exterior housing of the connection element is configured for the electromagnetic shielding of the internal conductor part, and it is correspondingly contact-connected, the necessity fora conductive enclosure for the shielding of the circuit board arrangement or of the circuit boards can be eliminated. The enclosure can then, for example, also be constituted of a non-conductive material and can be restricted in functionality to an exclusively mechanical function.

In a particularly advantageous manner, it is possible, according to the invention, to provide connection elements which are already fully preassembled and which in particular already comprise an exterior housing and an internal conductor part, preferably additionally an insulator between the exterior housing and the internal conductor part. Susceptibility to faults during the assembly of the circuit board arrangement can be significantly reduced as a result. Finally, personnel with less advanced training can be used for fitting the connection element to the circuit board arrangement. This is particularly advantageous where data transmission is complicated by large bandwidths and substantial miniaturization, and only very small installation tolerances are possible.

The connection element can optionally comprise discrete electrical components, electronic circuits, also optionally mounted on a circuit board, or other electrical components, in order to influence electrical signal transmission via the first and/or the second electrical path in a flexible manner, for example to improve it, in particular to adjust a signal level, to filter the signal, or to influence it in any other manner.

In a development of the invention it can be provided that the second circuit board incorporates a second through hole, wherein the second through hole and the connection element are configured such that the front end of the connection element is accommodated by the second through hole, when the connection element is located in the terminal position.

Within the meaning of the invention, the circuit boards can be oriented parallel to one another, when the through holes thereof are arranged coaxially to one another or in alignment with one another.

It can be provided that the second through hole, in the terminal position of the connection element, only accommodates the exterior housing, only accommodates the internal conductor part, or accommodates the exterior housing and the internal conductor part in combination.

It is also possible for the second circuit board to incorporate no second through hole, and for the front part of the connection element only to rest upon the second circuit board, or upon the inner side thereof which faces the first circuit board, at its end face.

In a development, it can be provided that the first through hole and/or the second through hole, on the inner surface, respectively comprise at least one electrical contact surface for the contact-connection of the first electrical path and/or of the second electrical path.

The first through hole and/or the second through hole can thus in particular be configured as through-connections ("vias").

It can be provided that the connection element contact-connects the first circuit board, in particular in the fully inserted terminal position of the connection element, wherein the exterior housing and/or the internal conductor part is/are accommodated by the first through hole and contact-connected in the first through hole.

It can moreover be provided that the connection element, in particular in the terminal position, contact-connects the second circuit board, wherein the exterior housing and/or the internal conductor part is/are accommodated by the second through hole and contact-connected in the second through hole.

It can also be provided that the first and/or second through hole can be employed for centering and/or securing and, to this end, accommodates the exterior housing and/or the internal conductor part, optionally without the constitution of an electrical contact.

It can also be provided that an end-face contact-connection of the exterior housing and/or of the internal conductor part in the region of the second circuit board is performed, for example in a conventional manner by means of soldering. Even in the case of an end-face contact-connection, a second through hole can nevertheless be provided, at least for the assistance of assembly or for centering and/or securing, for example wherein the internal conductor part or a pin is accommodated by the second through hole.

For example, it can be provided that the exterior housing and the internal conductor part, in the region of the first circuit board, contact-connect the circuit board within the first through hole whereas, in the region of the second circuit board, an end-face contact-connection is provided.

In the region of the through holes, shielding elements can be provided in order to electromagnetically shield the contact surfaces in the through holes. The shielding elements can be configured as through-contacts embodied in the form of "plugged vias", i.e. through-contacts which are completely filled with electrically conductive material.

In a development of the invention, it can in particular be provided that the first circuit board, on the outer side which is averted from the second circuit board, incorporates an outer contact region or, on an inner side which faces the second circuit board, incorporates an inner contact region for the contact-connection of the second electrical path of the connection element and/or that the second circuit board, on an outer side which is averted from the first circuit board, incorporates an outer contact region or, on an inner side which faces the first circuit board, incorporates an inner contact region for the contact-connection of the second electrical path of the connection element. The same applies analogously to the first electrical path.

It can thus be provided that the second electrical path which, in the terminal position of the connection element, is constituted by means of the internal conductor part between the two circuit boards, is constituted between contact regions on a surface (outer side or inner side) of the respective circuit boards—conversely to a contact-connection of a contact surface within the through hole. However, contact-connection within one or within both through holes is also possible, in order to constitute the second electrical path. Composite contact-connection is also possible, for example a contact-connection of the first end of the internal conductor part with a contact surface within the first through hole, and a contact-connection of the second end of the internal conductor part with a contact region on the surface of the second circuit board—or vice versa. The same also applies analogously to the first electrical path.

It can be provided that the exterior housing and/or the internal conductor part is/are soldered to the inner and/or outer contact region on the surface of the first and/or second circuit board.

In a development, it can in particular be provided that the circuit boards are located and positioned in relation to one another by means of a supporting structure of the circuit board arrangement.

The supporting structure can be, for example, at least one housing or enclosure and/or at least one frame. Further electrical plug connectors for the connection of the circuit boards and/or screw connections and riveted connections can also be provided.

In a development of the invention, it can be provided that the exterior housing of the connection element, at least in the region between the circuit boards, is configured in an electrically conductive manner and encloses the internal conductor part such that the internal conductor part is electromagnetically shielded.

The exterior housing can thus electromagnetically shield the internal conductor part in particular in the manner of an external conductor, in particular in order to permit the interference-free transmission of high-frequency electrical signals by means of the internal conductor part or via the second electrical path.

The exterior housing can, in particular, be electrically connected to an electrical ground connection of the respective circuit board, or to any other reference potential.

In principle, however, the exterior housing or the first electrical path can also be for the transmission of an additional electrical signal or for the transmission of electrical energy between the circuit boards.

In a development, it can moreover be provided that the exterior housing of the connection element, in the region of at least one of its two ends, incorporates a cutout, in order to provide access to the internal conductor part for the electrical contact-connection thereof and/or in order to bring the internal conductor part out of the exterior housing for the electrical contact-connection thereof.

In particular, the exterior housing can incorporate end-face access to its interior region, for example in the manner of a tube which is open at one or both ends. The internal conductor part can thus project out of one or out of both ends of the exterior housing, along the longitudinal axis of the exterior housing.

Alternatively, or additionally, a cutout can also be provided along the outer shell of the exterior housing, in order that the internal conductor part can be brought out laterally from the exterior housing. Exposure of the exterior housing can thus be provided over a specific angular range, in order to permit the feedthrough of the internal conductor part for contact-connection, for example within the through hole.

At this point, by way of precaution, it should be observed that, in the present context, an "end" of the exterior housing, of the internal conductor part or of the connection element is, in principle, to be understood as an end region, even where this is not explicitly indicated. Within the meaning of the invention, the term "end" or "region of an end", in addition to the geometrical actual end, is thus also to be understood as a region originating from the geometrical end which extends over up to 30% of the length of the connection element, of the internal conductor part and/or of the exterior housing in the longitudinal direction, for example up to 1%, 2%, 5%, 10%, 15% or 20%.

In a development of the invention, an insulator can be provided within the exterior housing of the connection element, in order to electrically insulate the exterior housing and the internal conductor part from one another and/or to radially and/or axially secure the internal conductor part in the exterior housing.

However, an insulator or dielectric is not absolutely essential. In principle, the internal conductor part and the exterior housing can also be configured such that they, in particular in the terminal position of the connection element, are secured between the circuit boards to a sufficient degree to prevent any mutual contact.

Preferably, however, an insulator is employed. A plurality of insulators or a multiple-piece insulator can also be provided. The exterior housing, between the inner surface thereof and the internal conductor part, can be entirely occupied by an insulator, or only partially have an insulator.

In a development of the invention, it can be provided that the first through hole has a larger diameter than the second through hole, and/or the first end of the exterior housing has a larger diameter than the second end of the exterior housing.

As the second through hole has a smaller diameter than the first through hole, the front end of the connection element can also have a smaller diameter. The connection element, at its front end, can thus be fed through or inserted into the first through hole in a simpler manner, in order to bring the connection element to its terminal position.

In a development, for the accommodation of the exterior housing of the connection element and/or of the internal conductor part in the first through hole and/or in the second through hole, an interference fit can be provided.

Thus, advantageously, a press-fit solution for a circuit board connector, in particular a coaxial circuit board connector, can be provided.

Slots can be provided in the longitudinal direction of the connection element, of the exterior housing and/or of the internal conductor part, in order to permit the displacement of material for the purposes of interference fitting. Alternatively or additionally, notches or other cutouts can also be provided.

In addition to interference fitting, it is possible to employ any other connection techniques for fastening the connection element, the exterior housing, the internal conductor part and/or the insulator, in particular in the terminal position of the connection element, to one of the circuit boards to any other structure for example also to the supporting structure. For example, a conventional soldered connection, or a latching connection which employs latching means, for example snap hooks, can also be provided. The connection element can also be secured in its terminal position by adhesive. Preferably, the connection element can be secured in its terminal position in a form-fitted, interference-fitted and/or materially bonded manner.

In a development, it can moreover be provided that the connection element, in the region of its front end and/or in the region of its rear end, which is averted from the front end, incorporates a limit stop, in order to obstruct axial movement of the connection element beyond the terminal position by a form-fitted arrangement, wherein the limit stop engages with the outer side of the first circuit board and/or with the inner side of the second circuit board.

Mechanical coding can further be provided, such that the connection element can only be inserted at an intended location within the circuit board arrangement and/or such that the connection element can only be inserted with a specific orientation. Mechanical coding can be provided, for example, by an asymmetrical through hole and a correspondingly matching geometry of the exterior housing.

In an advantageous development, it can be provided that the first through hole and/or the second through hole comprise(s) two contact surfaces which are electrically insulated from one another, in order to electrically connect both the exterior housing and the internal conductor part to the circuit board within the through hole.

The contact surfaces or contact-connection within the through hole can thus be interrupted, in order to permit an electrically insulated contact-connection of the internal conductor part and the exterior housing.

The first through hole and/or the second through hole can, for example, be metal-plated on their inner surfaces, in particular in the manner of a through-contact, wherein the metal plating is interrupted in at least two radial positions in the axial direction of the through hole, in order to provide two contact surfaces which are not electrically interconnected on the inner surface of the first and/or the second through hole.

It can be provided, for example, that the contact-connection of the internal conductor part is provided in a smaller bore, which is arranged eccentrically to the larger through hole for the contact-connection of the exterior housing.

Through holes of this type can in particular be advantageously employed for the accommodation of the exterior housing and the internal conductor part of the connection element in combination, and for the constitution of the electrical paths which are to be contact-connected. A contact-connection of the internal conductor part can in particular be permitted by the presence of a lateral cutout in the region of the corresponding end of the exterior housing, for the feedthrough of the internal conductor part.

In an advantageous development of the invention, it can further be provided that the internal conductor part, in the region of its first end, projects out of the exterior housing, in order to contact-connect the outer contact region of the first circuit board, when the connection element is located in its terminal position.

The connection element, at its front end, can be fed through the first through hole such that the front end of the connection element contact-connects the second circuit board, wherein, in the terminal position, the internal conductor part engages moreover with the outer side of the first circuit board, and thus contact-connects the outer contact region on the surface of the first circuit board. The internal conductor part can thus function as a terminal limit stop.

In an advantageous development of the invention, the internal conductor part, in the region of its second end, can moreover project laterally out of the exterior housing, in order to contact-connect the inner contact surface of the second circuit board, when the connection element is located in its terminal position, wherein the first through hole incorporates a feedthrough in order to permit the passage of the laterally projecting internal conductor part during the routing of the connection element through the first through hole.

It can thus be provided that the internal conductor part, which projects laterally out of the exterior housing of the connection element in the region of the front end, in the terminal position of the connection element, engages with the inner side of the second circuit board, in order to contact-connect the inner contact surface on the surface of the second circuit board, such that the second electrical path is constituted. The internal conductor part can thus also function as a terminal limit stop.

The feedthrough of the first through hole can preferably be configured as a radial slot and/or as a small bore which is arranged eccentrically in relation to the through hole. Other configurations are also possible. The only requirement is that the connection element, at its front end, notwithstanding the laterally projecting internal conductor part, can still be passed through the first through hole.

In particular, it is also possible that the internal conductor part, in the region of its first end, projects out of the exterior housing in order to contact-connect the outer contact region of the first circuit board and, in the region of its second end, projects laterally out of the exterior housing in order to contact-connect the inner contact surface of the second circuit board, when the connection element is located in its terminal position.

In this case, it can be advantageous to ensure that the radial extension of the internal conductor part, by means of which the internal conductor part, in the region of its second end, projects laterally out of the exterior housing, is smaller than the radial extension by means of which the internal conductor part, in the region of its first end, projects laterally out of the exterior housing, and that the feedthrough of the first through hole is dimensioned to permit the passage of the internal conductor part which projects out of the second end of the connection element but not, however, the internal conductor part which projects out of the first end, as a result of which both ends of the internal conductor part can engage with the respective contact regions on the surfaces of the circuit boards, and can contact-connect the latter.

In a development, it can moreover be provided that the internal conductor part, in an initial state, is entirely arranged within the exterior housing of the connection element, wherein at least one clamping wedge is provided, which can be inserted into the exterior housing of the connection element, and is configured such that the internal conductor part, in the region of at least one of its two ends, preferably in the region of both ends, is bent out through the cutouts in the exterior housing, in order to contact-connect the inner contact region of at least one of the circuit boards.

In this variant, it can be particularly advantageous that the connection element, after the bending out of both ends of the internal conductor part, is automatically secured between the circuit boards in a form-fitted manner.

Preferably, a single clamping wedge is provided, which can be inserted into the connection element from one of the two ends of the exterior housing.

However, two clamping wedges can also be provided, wherein a first clamping wedge, starting from the first end of the exterior housing, and a second clamping wedge, starting from the second end of the exterior housing, can be inserted into the connection element. The first clamping wedge can then be provided for the bending of the internal conductor part in the region of its first end, whereas the second clamping wedge can be provided for the bending of the internal conductor part in the region of its second end.

The clamping wedge(s) can be employed as electrical insulators.

The clamping wedge(s), after the employment thereof for the bending of the internal conductor part, can remain in the connection element or can be extracted from the latter. Preferably, however, the at least one clamping wedge remains in the connection element.

The clamping wedge can be inserted into the connection element starting from the first circuit board and/or from the second circuit board.

In a development, the internal conductor part, in the region of at least one of its two ends, can be configured elastically or resiliently, in order to permit a mechanically stable electrical contact-connection with the circuit board.

For example, the internal conductor part, in the region of at least one of its ends, can incorporate a spring tab, which is optimized in particular for high-frequency engineering.

The internal conductor part, in particular in the contact region, can thus be elastically deformed, such that a sufficient contact pressure is exerted on a contact surface within the through hole and/or on a contact region of an inner or outer side of the circuit board.

If, in an embodiment, more than two circuit boards are provided in the circuit board arrangement, a third circuit board, for example, can be arranged between the first circuit board and the second circuit board and incorporates a third through hole which is arranged coaxially to the first through hole of the first circuit board, as a result of which the connection element, at its front end, starting from the first circuit board, can be fed through the first through hole, thereafter optionally through an interspace between the first circuit board and the third circuit board, thereafter through the third through hole and, in turn, thereafter through an optionally present interspace between the third circuit board and the second circuit board, until the connection element achieves the terminal position by the contact-connection of the second circuit board. In this manner, an arbitrary number of further circuit boards can be provided in the circuit board arrangement, through which the connection element can be fed. The connection element can thus be configured to further constitute an electrical contact-connection with the further circuit boards, for example the third circuit board, in particular by means of the exterior housing. Finally, the exterior housing can also incorporate a further cutout in the region of the through hole of the further circuit board, in order also to permit a contact-connection of the internal conductor part with the further circuit board, for example within the through hole thereof, or on an outer/inner contact region of the surface of the further circuit board.

A plurality of connection elements can also be provided within the circuit board arrangement according to the invention. The number of connection elements within the circuit board arrangement is not limited, such that, for example, two, three, four, five or even more connection elements can be provided. The connection elements can be identically configured in each case, or can respectively be designed differently. The connection elements can also be provided for the connection of different circuit boards, if more than two circuit boards are provided in the circuit board arrangement.

The invention further relates to a connection element for a circuit board arrangement according to the above statements.

The connection element is preferably not a cable.

It can be provided that the connection element is configured to compensate an offset in distance and/or in parallelism (or an "angular offset") between the circuit boards, at least within a limited tolerance range.

The invention further relates to a method for assembling at least one connection element in a preassembled circuit board arrangement comprising at least one first circuit board and a second circuit board, which are arranged in a parallel orientation to one another in different planes. The connection element comprises an exterior housing, which encloses an internal conductor part of the connection element, wherein a first end of the exterior housing is connected to the first circuit board and a second end of the exterior housing is connected to the second circuit board, in an electrically conductive manner, to constitute a first electrical path, and wherein a first end of the internal conductor part is connected to the first circuit board and a second end of the internal conductor part is connected to the second circuit board, in an electrically conductive manner, to constitute a second electrical path. In the method, according to the invention, it is provided that the connection element, for the assembly thereof between the circuit boards, is inserted from an outer side of the first circuit board, which is averted from the second circuit board, into a first through hole, until the connection element achieves a terminal position in the circuit board arrangement, in which a front end of the connection element which is fed through the first through hole contact-connects the second circuit board, and the connection element constitutes the electrical paths.

The connection element is preferably configured as a rigid connection element. To this end, for example, the exterior housing of the connection element can be configured with an inflexible or rigid design.

In a development of the method, it can be provided that, in a second assembly step, the internal conductor part, in the region of at least one of its two ends, is bent out through a cutout in the exterior housing, such that the internal conductor part contact-connects a contact region on an outer side or an inner side of at least one of the two circuit boards.

In principle, the bending, bending out or expulsion of the internal conductor part can be performed in any manner, including manually by a fitter.

In a preferred development, however, it can be provided that at least one clamping wedge is employed which, starting from the first and and/or the second end of the exterior housing of the connection element, is inserted into the connection element in order to bend the internal conductor part.

By the employment of the at least one clamping wedge, the internal conductor part, for example in the region of the first circuit board, can be bent about a bending point or a center of rotation, such that the first end of the internal conductor part is compressed against the inner contact region of the first circuit board with sufficient force, in the manner of a "rocker".

In the region of the second circuit board, the internal conductor part can preferably be bent by the at least one clamping wedge, such that it is compressed against the inner side of the second circuit board or against the inner contact region thereof.

Preferably, only one clamping wedge is employed which, in a plug-in direction, along which the assembly of the connection element between the circuit boards is also performed, starting from the first end of the external conductor, is inserted into the connection element. However, the clamping wedge is also insertable or can be inserted counter to the plug-in direction.

Naturally, features which have already been described with reference to the circuit board arrangement according to the invention can also advantageously be applied to the method according to the invention or the connection element—and vice versa. Moreover, advantages which have already been specified with reference to the circuit board arrangement according to the invention are also understood to relate to the method according to the invention or the connection element—and vice versa.

In principle, the invention or the circuit board arrangement, the connection element and the method for assembling the at least one connection element are appropriate for the entire electrotechnical sector. However, the invention may be particularly suitable for employment in high-frequency engineering.

It should in particular be observed that the connection element according to the above description, in particular, non-preferred configurations, can also be suitable for the electrical interconnection of circuit boards of a circuit board arrangement, in the context of the sandwich construction according to the prior art.

The invention relates to a circuit board arrangement, comprising at least one first circuit board and a second circuit board, wherein at least one rigid connection element is arranged between the circuit boards, wherein the connection element comprises an exterior housing, which encloses an internal conductor part of the connection element, and wherein a first end of the exterior housing is connected to the first circuit board and a second end of the exterior housing is connected to the second circuit board, in an electrically conductive manner, to constitute a first electrical path, and wherein a first end of the internal conductor part is connected to the first circuit board and a second end of the internal conductor part is connected to the second circuit board, in an electrically conductive manner, to constitute a second electrical path. In the context of the independent invention, it is provided that the first circuit board incorporates a first through hole, wherein the first through hole and the connection element are configured such that the connection element, at a rear end, is insertable into the first through hole, and wherein the second circuit board incorporates a second through hole, wherein the second through hole and the connection element are configured such that the connection element, at a front end, is insertable into the second through hole, wherein the connection element, in a terminal position, in which the ends thereof are accommodated by the through holes, contact-connects the circuit boards, in order to constitute the electrical paths.

The front and/or rear end of the connection element can be configured such that the latter can be inserted into the first and/or second through hole, but cannot entirely be fed through the latter.

In particular, according to the invention, it can be provided that the first through hole and/or the second through hole are configured as through-contacts and, on the inner surfaces thereof, incorporate at least one contact surface in order to electrically connect the exterior housing and/or the internal conductor part to the circuit board within the through hole.

In particular, it can be provided that the first through hole and/or the second through hole of the second circuit board comprise(s) two mutually electrically insulated contact surfaces, in order to electrically connect the exterior housing and the internal conductor part to the circuit board within the through hole. This preferably applies to the second through hole.

In a variant of the invention, it can be provided that the first circuit board, on the inner side thereof which faces the second circuit board, incorporates an inner contact surface, in order to electrically connect a first end of the internal conductor part, which projects laterally out of the exterior housing in the region of the rear end of the connection element, with the first circuit board.

In a variant of the invention, it can moreover be provided that the second circuit board, on the inner side thereof which faces the first circuit board, incorporates an inner contact surface, in order to electrically connect a second end of the internal conductor part, which projects laterally out of the exterior housing in the region of the front end of the connection element, with the second circuit board.

In particular, it can also be provided that both ends of the internal conductor part are connected to inner contact surfaces of both circuit boards, in order to contact-connect an internal conductor part which, at both ends thereof, projects laterally out of the exterior housing in the region of the ends of the connection element, in a sandwich-type arrangement.

In principle, the connection element of the independent invention can be assembled within the circuit board arrangement such that, firstly, the connection element is electrically connected to the second circuit board and thereafter, upon the fitting of the first circuit board, is also connected to the first circuit board, in order to constitute the electrically conductive paths.

In particular, the invention can advantageously be employed to compensate a larger offset in parallelism between the circuit boards. Moreover, the distance between the circuit boards can be easily adjustable by means of the connection element or the length thereof, or an offset in distance can be corrected.

Advantageous embodiments and developments of the invention proceed from the statements, developments and the disclosed individual features regarding the circuit board arrangement, the connection element and the method.

The present circuit board arrangement, the connection element and the method are suitable for any applications within the entire field of electrotechnology, but can be employed in a particularly advantageous manner in the field of high-frequency engineering and data processing, as electronics can be subject to particularly stringent requirements with respect thereto, in particular as a result of progressive miniaturization and increasing data processing speeds. The invention is particularly suitable for electronic devices having a printed circuit board sandwich structure. The invention can thus be particularly advantageously employed in base stations for mobile radio networks, in measuring devices and measuring systems for high-frequency engineering, and in mainframe computers having stacked circuit boards.

Additionally, it should be observed that terms such as "comprising", "incorporating" or "having" do not exclude any other features or steps. Moreover, terms such as "a/an" or "the", which allude to a singularity of steps or features, do not exclude a plurality of features or steps—and vice versa.

BRIEF DESCRIPTIONS OF THE DRAWINGS

Exemplary embodiments of the invention are described in greater detail hereinafter with reference to the accompanying drawings.

In each case, the figures show preferred exemplary embodiments, in which individual features of the present invention are represented in combination with one another. Features of one exemplary embodiment can also be implemented separately from the other features of the same exemplary embodiment and, correspondingly, can be readily combined by a person skilled in the art with features of other exemplary embodiments to constitute further appropriate combinations and sub-combinations.

In the figures, functionally equivalent elements are identified by the same reference numbers.

In the figures, schematically:

FIG. 20 shows a connection element in its terminal position between two circuit boards according to a first variant of an independent invention, in an isometric representation.

FIG. 21 shows the connection element according to FIG. 20, in a sectional representation.

DETAILED WRITTEN DESCRIPTION OF THE PREFERRED EMBODIMENTS

Figure 1:
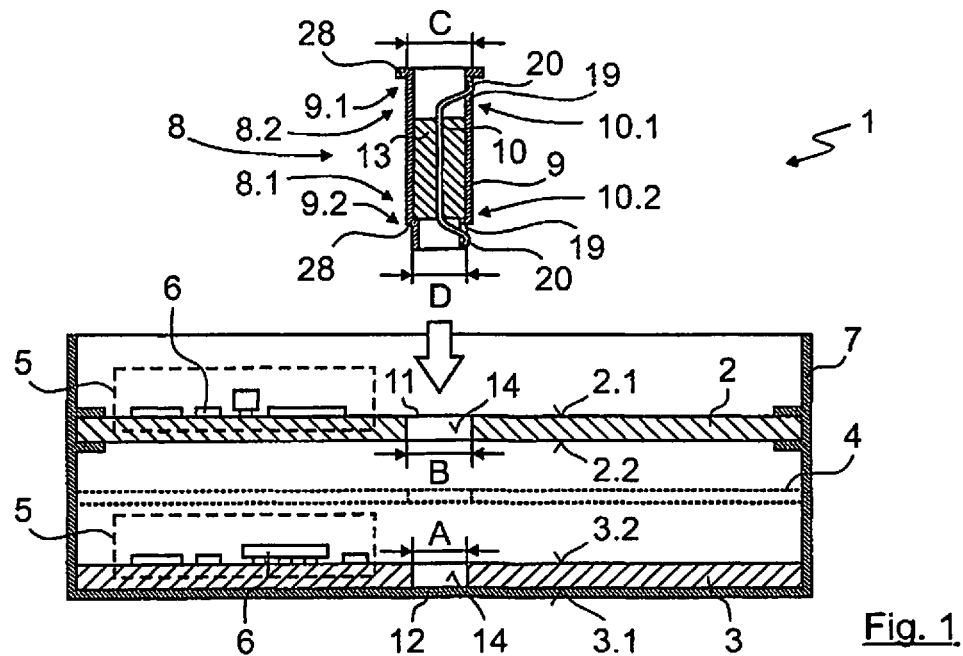
FIG. 1 shows a circuit board arrangement according to the invention, having a first circuit board and a second circuit board, and a connection element according to the invention, according to a first embodiment.

FIG. 1 shows a circuit board arrangement 1, comprising a first circuit board 2 and a second circuit board 3, which are configured in a parallel offset arrangement in relation to one another. In principle, the invention can be applied to any number of circuit boards including, for example also three, four or five circuit boards. In the present case, the number of circuit boards is not addressed. In the interests of simplification, the invention is described hereinafter with reference to the first circuit board 2 and the second circuit board 3, although the invention is not limited hereto. For exemplary purposes only, a third circuit board 4 is represented in FIG. 1 by a broken line.

The circuit boards 2, 3, 4 can respectively comprise electrical circuits 5 which, for example, are constituted by a plurality of interconnected electrical components 6, as represented in FIG. 1 in the left-hand sub-region of the first circuit board 2 and of the second circuit boards 3.

The circuit board arrangement 1 can preferably comprise a supporting structure 7, for example in the form of an enclosure, which secures the circuit boards 2, 3, 4 and positions them in relation to one another. However, a supporting structure 7 can also be omitted.

It is possible to arrange at least one rigid connection element 8 between the circuit boards 2, 3, 4, wherein the connection element 8 comprises an exterior housing 9 which encloses an internal conductor part 10 of the connection element 8 preferably in a tubular manner. The exterior housing 9 can thus preferably be configured in an essentially closed arrangement, although this is not absolutely necessary.

In FIG. 1, in the interests of clearer representation, the connection element 8 is shown in an unassembled state, externally to the circuit boards 2, 3, 4. In principle, a first end 9.1 of the exterior housing 9 of the connection element 8 can be connected to the first circuit board 2 and a second end 9.2 of the connection element 8 can be connected to the second circuit board 3, in an electrically conductive manner, in order to constitute a first electrical path, wherein a first end 10.1 of the internal conductor part 10 is connected to the first circuit board 2 and a second end 10.2 of the internal conductor part can be connected to the second circuit board 3, in an electrically conductive manner, in order to constitute a second electrical path.

It is provided that the first circuit board 2 incorporates a first through hole 11, wherein the first through hole 11 and the connection element 8 are configured such that the connection element 8 is insertable from an outer side 2.1, which is averted from the second circuit board 3, of the first circuit board 2 into the first through hole 11, wherein a front end 8.1, which is fed through the first through hole 11, of the connection element 8, in a terminal position of the connection element 8, contact-connects the second circuit board 3, and the connection element 8 constitutes the electrical paths.

Preferably, the second circuit board 3 incorporates a second through hole 12, wherein the second through hole 12 and the connection element 8 are configured such that the front end 8.1 of the connection element is accommodated by the second through hole 12, when the connection element 8 is located in the terminal position.

In the exemplary embodiment according to FIG. 1, the first through hole 11 has a diameter B which is greater than a diameter A of the second through hole 12. The front end 8.1 of the connection element 8 also has a diameter D in order that it can be accommodated in the second through hole 12 by interference fitting, wherein a rear end 8.2 of the connection element 8 has a diameter C which essentially corresponds to the diameter B of the first through hole 11, in order that it can be accommodated in the latter by interference fitting. The first through hole 11 can thus have a larger diameter B than the second through hole 12. However, this is not absolutely necessary. Accommodation of the exterior housing 9 of the connection element 8 and/or of the internal conductor part 10 in the first through hole 11 and/or in the second through hole 12 can in particular be provided by means of a press-fit.

In the exemplary embodiments, it is provided that an insulator 13 within the exterior housing 9 of the connection element 8 electrically insulates the exterior housing 9 and the internal conductor part 10 from one another and/or radially and/or axially secures the internal conductor part 10 in the exterior housing 9. However, the insulator 13 can also be omitted. The insulator 13 can be configured as a one-piece component, as represented in FIG. 1, or else be configured as a multiple-piece component, as represented, for example, in FIG. 3 hereinafter.

The circuit board arrangement 1 can also comprise more than one connection element 8.

For the assembly of the at least one connection element 8, it can be provided that the connection element 8 is inserted from the outer side 2.1 of the first circuit board 2, which is averted from the second circuit board 3, into the first through hole 11, until the connection element 8 achieves its terminal position in the circuit board arrangement 1, in which the front end 8.1 of the connection element 8 which is fed through the first through hole 11 contact-connects the second circuit board 3, and the connection element 8 constitutes the electrical paths. Assembly takes place along a plug-in direction, which is indicated in FIG. 1 by an arrow.

For electrical contact-connection in the terminal position, various advantageous embodiments are possible and are represented in greater detail in FIGS. 2 to 19 and described hereinafter. In principle, the various embodiments are mutually combinable in an arbitrary manner, provided that this is not technically excluded.

Figure 2:
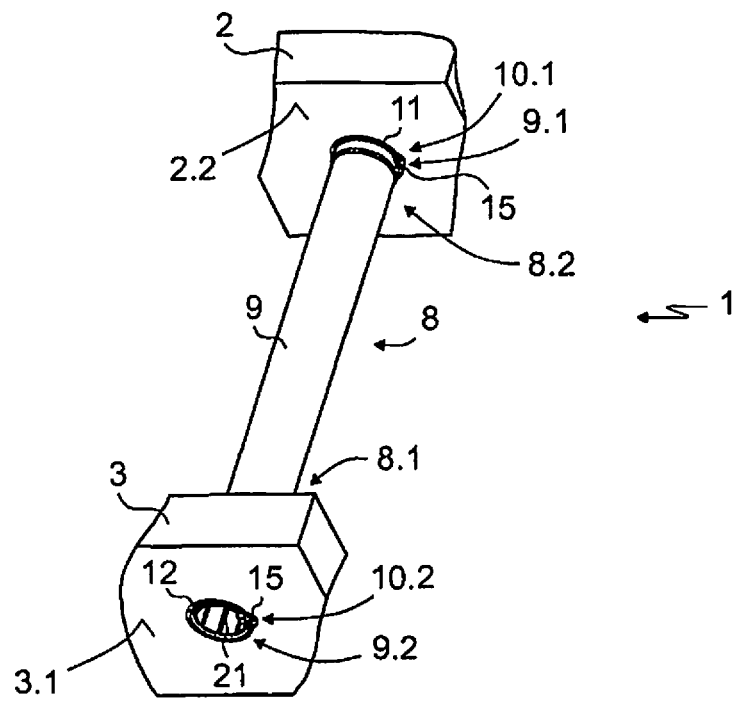
FIG. 2 shows a connection element in its terminal position between two circuit boards in a second embodiment, in an isometric representation.
Figure 3:
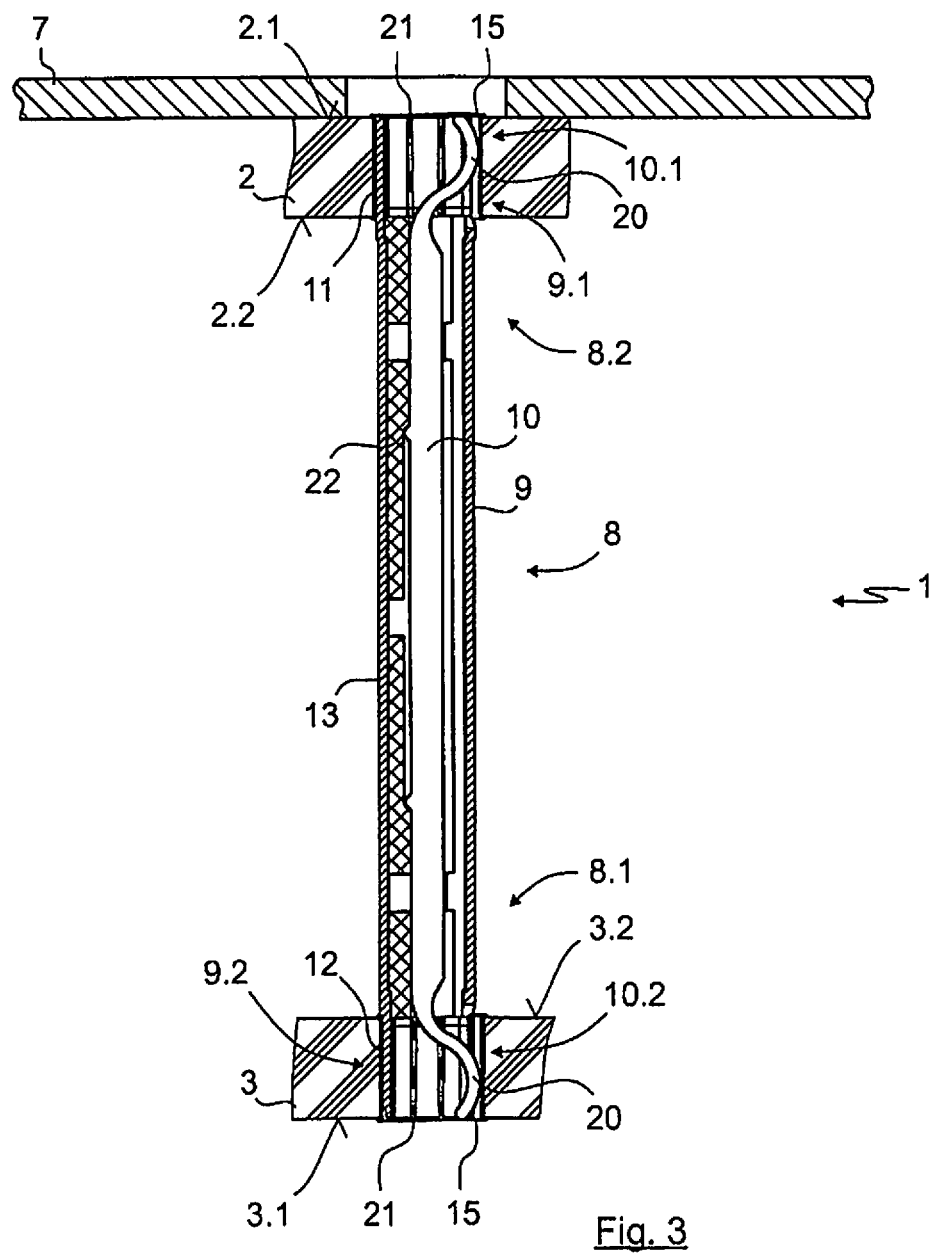
FIG. 3 shows the connection element according to FIG. 2 in a sectional representation.

FIGS. 2 and 3 show an embodiment of the connection element 8 which is arranged in its terminal position between the first circuit board 2 and the second circuit board 3. FIG. 2 shows an isometric representation, whereas FIG. 3 represents a section through the connection element 8.

In principle, it can be provided that the first through hole 11 and/or the second through hole 12, at the respective inner surface thereof, comprise(s) at least one electrical contact surface 14 for the contact-connection of the first electrical path and/or of the second electrical path. The through holes 11, 12 can thus in particular be configured in the manner of through-contacts ("vias"). In the exemplary embodiment according to FIGS. 2 and 3, the first through hole 11 and the second through hole 12 respectively comprise two contact surfaces 14 which are electrically insulated from one another, in order to electrically connect the exterior housing 9 and the internal conductor part 10 to the circuit board 2, 3 within the through hole 11, 12.

Figure 5:
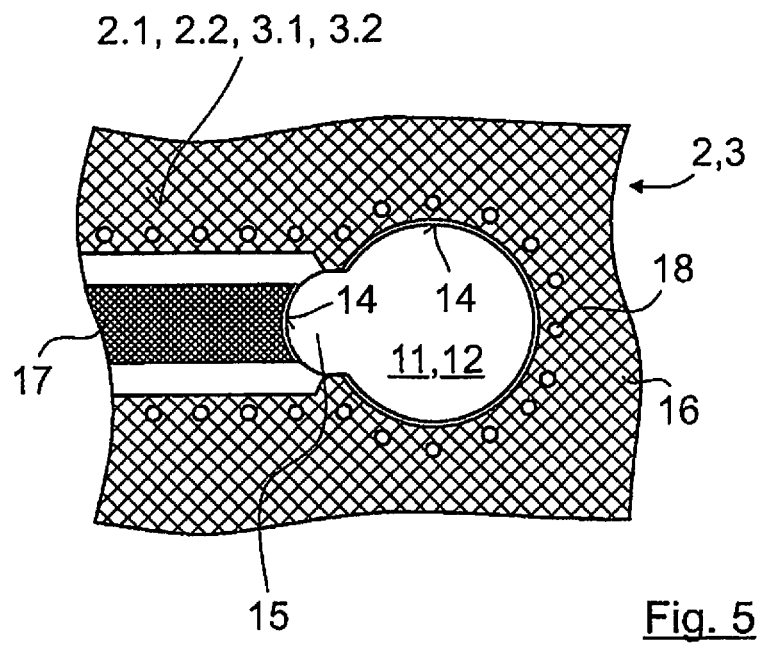
FIG. 5 shows a plan view of a potential configuration of a through hole of a circuit board, having an eccentric second bore, which constitute two mutually electrically insulated contact surfaces.

A plan view of a through hole 11, 12 which can be employed in the embodiments according to FIGS. 2 and 3 is represented in FIG. 5. The internal conductor part 10 is contact-connected in a radially offset or eccentrically arranged smaller bore 15. The exterior housing 9 can be contact-connected directly in the region of the through hole 11, 12. To this end, the through hole 11, 12 and the eccentric bore 15, at their inner surfaces, can be at least partially metal-plated, and can constitute the electrical contact surfaces 14.

A configuration of the through hole 11, 12 in the manner of FIG. 5 can also be employed as a form of mechanical coding, such that the connection element 8 can only be plugged into the circuit boards 2, 3, 4 in an intended orientation.

The exterior housing 9 of the connection element 8 can preferably in particular be employed for electromagnetic shielding, more particularly when the internal conductor part 10 is to be employed for the transmission of high-frequency electrical signals. In this case, it can be provided that the exterior housing 9 of the connection element 8, at least in the region between the circuit boards 2, 3, 4 is configured in an electrically conductive manner and encloses the internal conductor part 10 in a tubular arrangement, such that the internal conductor part 10 is electromagnetically shielded. The inner contact surface 14 of the through hole(s) 11, 12 for the contact-connection of the exterior housing 9 can then be connected, for example, to a printed ground conductor 16 of the corresponding circuit board 2, 3, 4. The contact surface 14 for the contact-connection of the internal conductor part 10 can further be connected to a printed signal conductor 17 of the circuit board 2, 3, 4, in order to constitute an electrical connection with the electrical circuit 5 of the circuit board 2, 3, 4.

Figure 6:
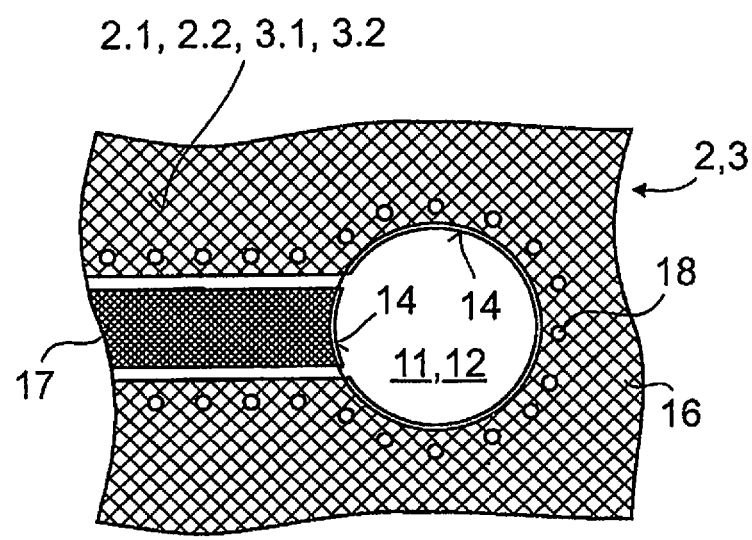
FIG. 6 shows a plan view of a further potential configuration of a through hole of a circuit board, having two mutually electrically insulated contact surfaces.

In place of an eccentric bore 15 for the contact-connection of the internal conductor part 10, a through hole 11, 12, in the manner represented in FIG. 6, can also be provided. Again, in this embodiment, two contact surfaces 14 are provided. In the present case, the contact surfaces 14 are constituted by the metal plating at two radial positions within the through hole 11, 12 being interrupted in an axial direction of the through hole 11, 12. Accordingly, an eccentric bore 15 is not absolutely necessary.

In the interests of improved shielding, it can be provided that "plugged vias" 18 are arranged in particular around the region of the through hole 11, 12. These are generally through-contacts which are entirely filled with metal, and which are connected to a printed ground conductor.

For the contact-connection of the internal conductor part 10 within the through hole 11, 12, the exterior housing 9 of the connection element 8, in the region of at least one of its two ends 8.1, 8.2 and, in the exemplary embodiment, in the region of both ends 8.1, 8.2, can incorporate a cutout 19 (cf. FIG. 1), in order to provide access to the internal conductor part 10 for the electrical contact-connection thereof. The exterior housing 9 is thus open over a specific angular region, from which the internal conductor part 10 projects in order to contact-connect the contact surface(s) 14 within the through hole(s) 11, 12.

The internal conductor part 10, at least in the region of one of its two ends 10.1, 10.2, can be configured elastically or resiliently, in order to permit a mechanically stable electrical contact-connection with the circuit board 2, 3, 4. To this end, the internal conductor part 10, in the region of its ends 10.1, 10.2, can incorporate spring tabs 20.

As mentioned above, the connection element 8 can be secured in the first circuit board 2 and/or in the second circuit board 3 by means of a press-fit. To this end, in FIGS. 2 and 3, slots 21 are represented by way of example in the region of both ends 9.1, 9.2 of the exterior housing 9 of the connection element 8, in order to permit a corresponding displacement of material.

In FIG. 3, a multiple-piece insulator 13 is represented by way of example, which electrically insulates the internal conductor part 10 and the exterior housing 9 from one another, and moreover secures the internal conductor part 10 radially and axially within the exterior housing 9, for the purpose of which a recess 22 is provided, in which the internal conductor part 10 engages.

Figure 4:
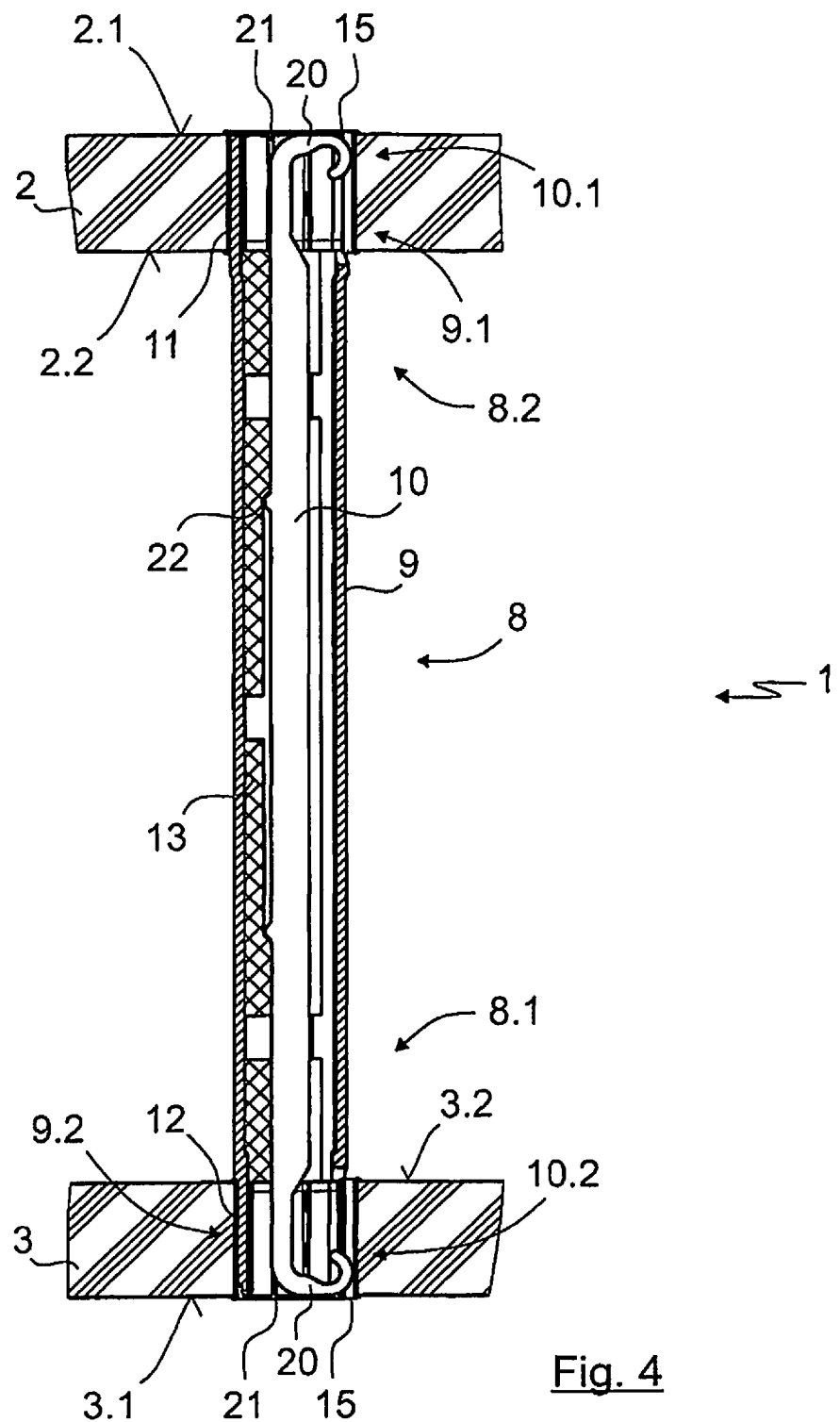
FIG. 4 shows a connection element in its terminal position between two circuit boards in a third embodiment, in a sectional representation.

In principle, it can be advantageous if the connection element 8, the exterior housing 9 and/or the internal conductor part 10 is/are configured for the transmission of high-frequency electrical signals. In particular, the configuration of the spring tabs 20 for the electrical contact-connection of the circuit boards 2, 3, 4 can be relevant for this purpose. For example, FIG. 4 shows an embodiment of the connection element which corresponds to the embodiment according to FIG. 3, with the exception of the configuration of the spring tabs 20.

Figure 7:
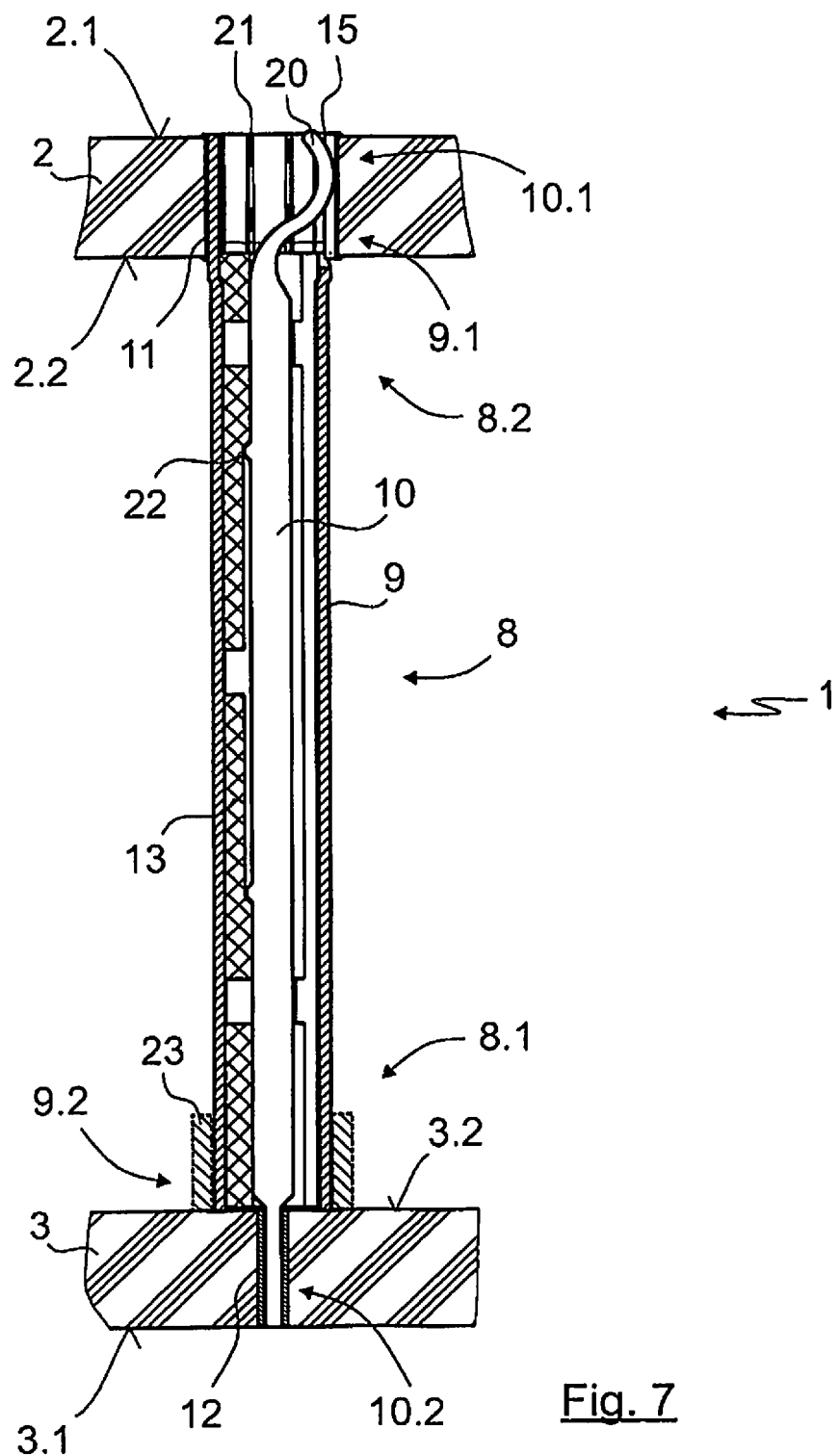
FIG. 7 shows a connection element in its terminal position between two circuit boards according to a fourth embodiment, in a sectional representation.

A fourth embodiment of the connection element 8 is represented in FIG. 7. In the interests of simplification, only the differences from the preceding embodiments will be addressed. The same also applies to the following figures.

In principle, in the region of the second circuit board 3, an end-face contact-connection of the connection element 8 can also be provided, when the connection element 8 is located in its terminal position. A conventional soldered connection can be provided here, for example. In the exemplary embodiment according to FIG. 7, a second through hole 12 is also provided which, however, only accommodates the internal conductor part 10. For the contact-connection of the internal conductor part 10, this is not absolutely necessary. The second through hole 12 in the embodiment according to FIG. 7 can also serve merely for mechanical guidance and centering (or can be omitted), in particular when the internal conductor part 10 is soldered to the second circuit board 3, for example at its end face.

For contact-connection and/or guidance, in addition or as an alternative to a second through hole 12, a locator or a plug connection 23 can be provided, into which the front end 8.1 of the connection element 8 can be plugged in the plug-in direction. This is represented in FIG. 7 by broken lines.

Figure 8:
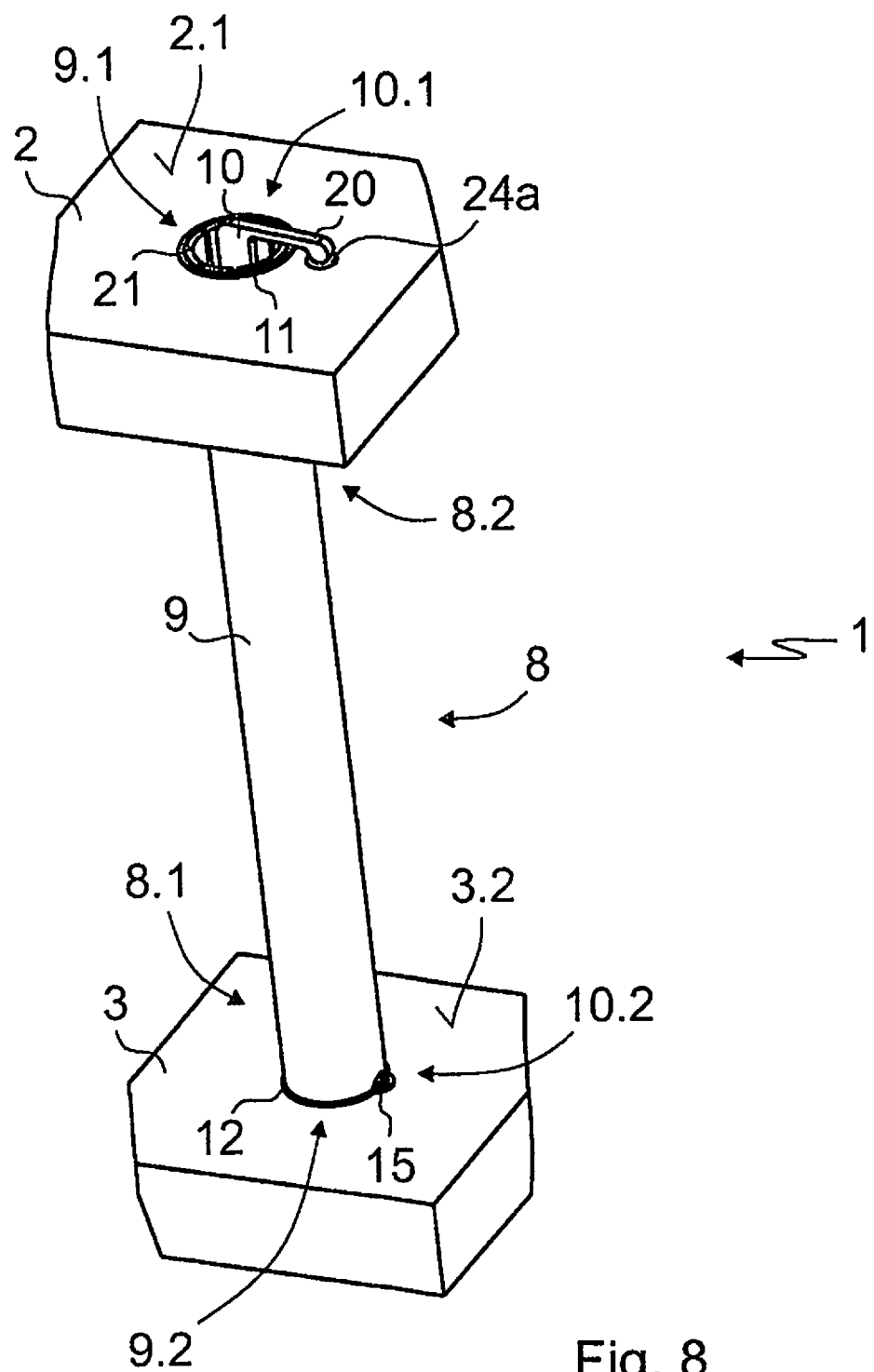
FIG. 8 shows a connection element in its terminal position between two circuit boards in a fifth embodiment, in an isometric representation.
Figure 9:
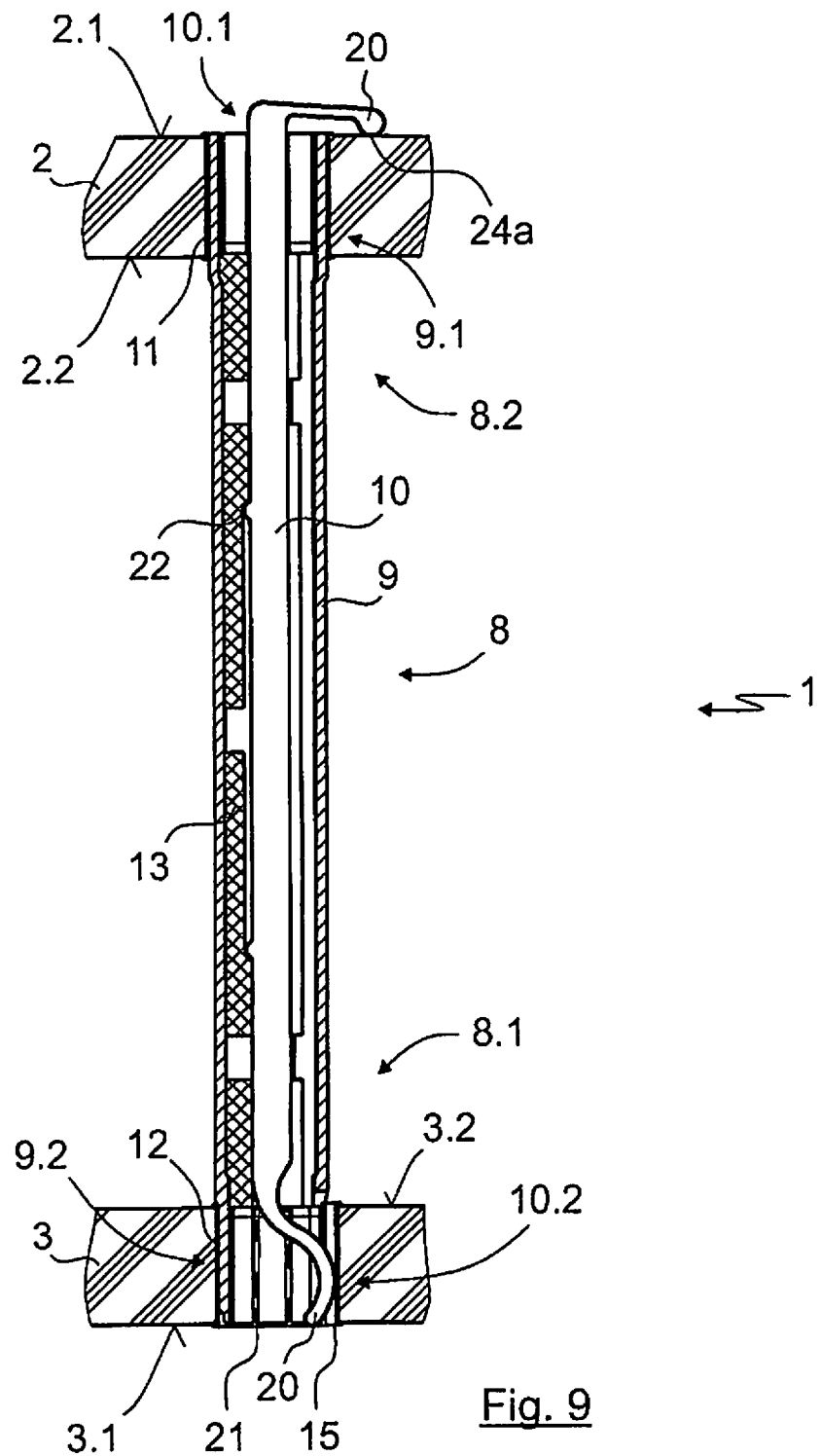
FIG. 9 shows the connection element according to FIG. 8, in a sectional representation.

FIGS. 8 and 9 show a fifth embodiment of the connection element 8 in its terminal position between the first circuit board 2 and the second circuit board 3. The first circuit board 2, at the outer side 2.1 thereof which is averted from the second circuit board 3, incorporates an outer contact region 24*a* for the contact-connection of the second electrical path of the connection element 8, wherein the first end 10.1 of the internal conductor part 10 or the spring tab 20 contact-connects the outer contact region 24*a*. To this end, the first end 10.1 of the internal conductor part 10 is brought out of the first end 9.1 of the exterior housing 9. The tubular exterior housing 9 is thus open in the region of its first end 9.1 or in the region of the rear end 8.2 of the connection element 8.

Figure 10:
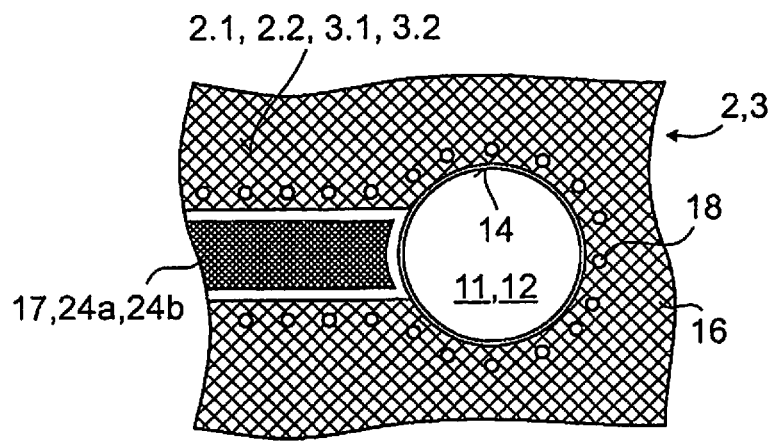
FIG. 10 shows a plan view of a circuit board having a contact region and a through hole having a contact surface.

The exterior housing 9, as previously, is contact-connected within the first through hole 11. In this case, however, the first through hole 11 can be configured in an entirely or continuously electrically conductive manner, i.e. can incorporate an entirely continuous contact surface 14 for the contact-connection of the exterior housing 9, as is represented in FIG. 10 in a plan view of a through hole 11, 12.

In the exemplary embodiment according to FIGS. 8 and 9, the connection element 8 is contact-connected with the second circuit board 12 as above, as already described in the exemplary embodiment according to FIGS. 2 and 3, namely within the second through hole 12, by the employment of two mutually insulated contact surfaces 14.

Figure 11:
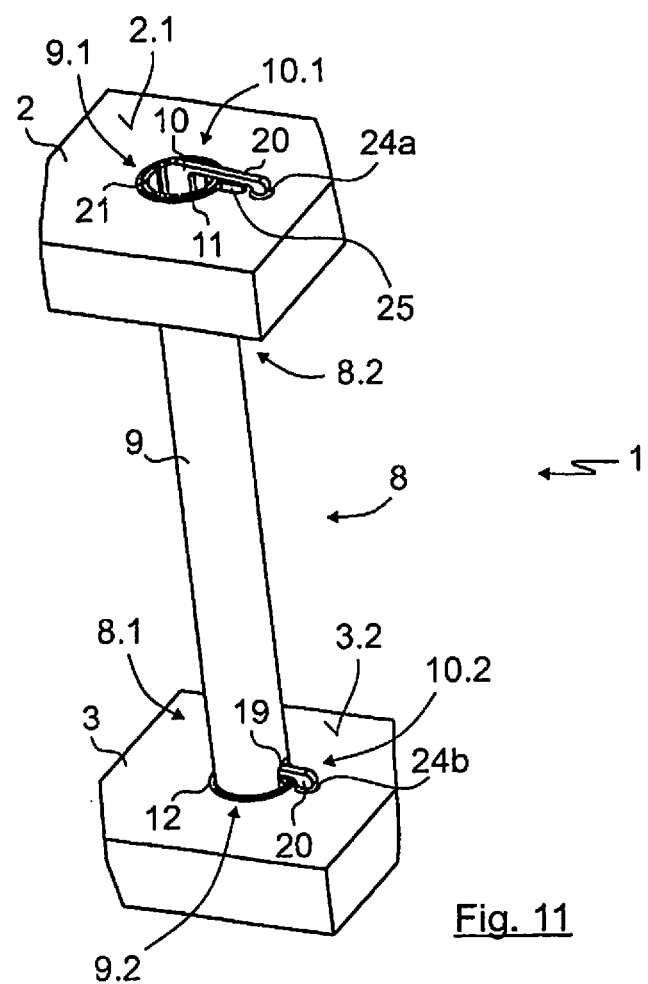
FIG. 11 shows a connection element in its terminal position between two circuit boards according to a sixth embodiment, in an isometric representation.
Figure 12:
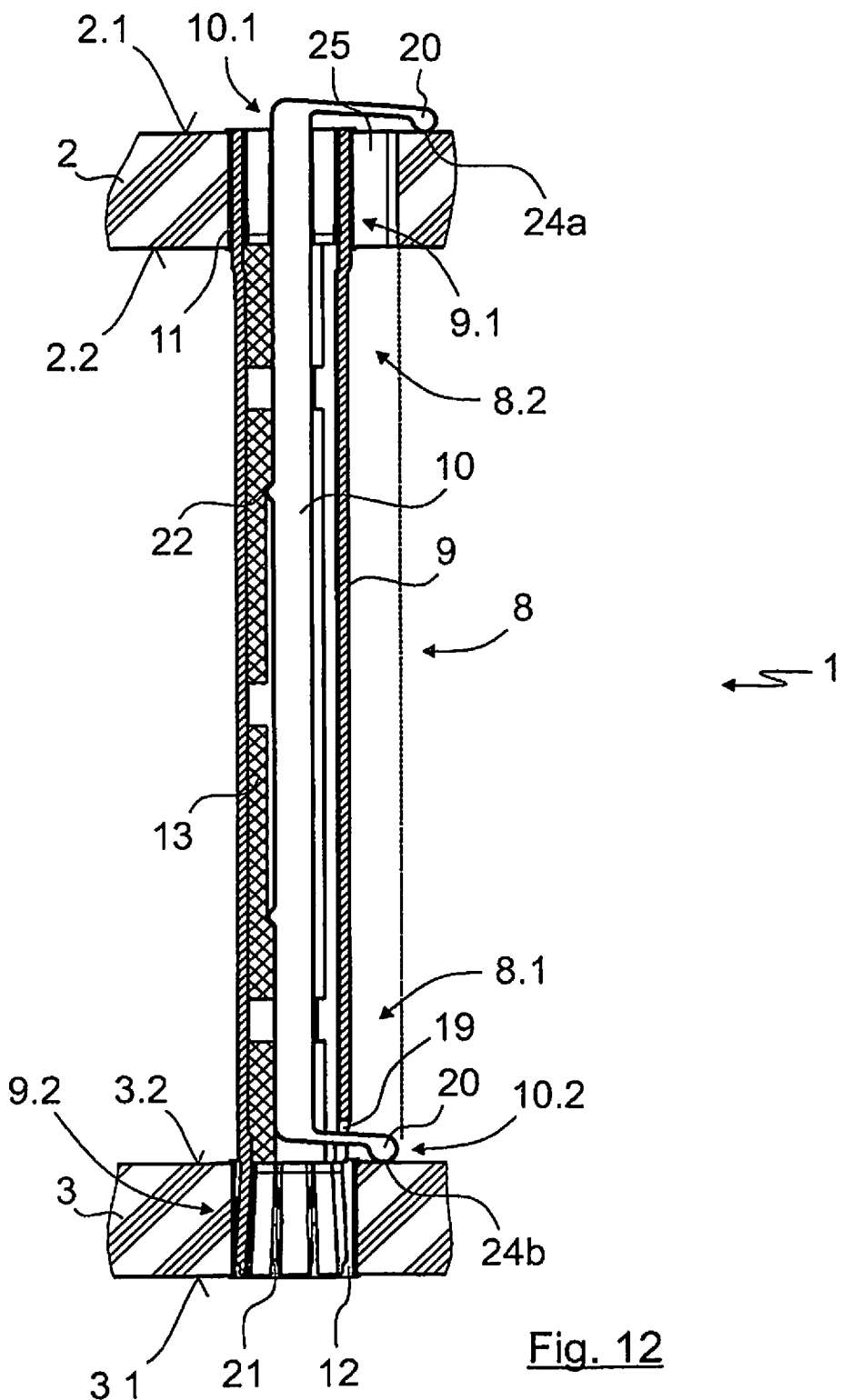
FIG. 12 shows the connection element according to FIG. 11, in a sectional representation.

In FIGS. 11 and 12, a further exemplary embodiment is represented, in which the internal conductor part 10, at a spring tab 20 thereof which is arranged in the region of the first end 10.1 thereof, likewise contact-connects the outer contact region 24*a* of the first circuit board 2. However, the contact-connection of the connection element 8 with the second circuit board 3 differs from the preceding embodiments. The second circuit board 3, at an inner side 3.2 which faces the first circuit board 2, incorporates an inner contact region 24*b* for the contact-connection of the second end 10.2 or the spring tab 20 of the internal conductor part 10 of the connection element 8. To this end, the internal conductor part 10 is laterally brought out of the exterior housing 9 in the region of the second end 9.2 of the exterior housing 9.

The internal conductor part 10, in the region of its second end 10.2, thus projects laterally out of the exterior housing 9, in order to contact-connect the inner contact surface 24*b* of the second circuit board 3, when the connection element 8 is located in its terminal position. However, in order to permit the passage of the connection element 8, at its front end 8.1, through the first through hole 11, as previously, the first through hole 11 incorporates a correspondingly dimensioned feedthrough 25. It is thus ensured that the first end 10.1 of the internal conductor part 10 projects laterally further out of the exterior housing 9 than the second end 10.2 of the internal conductor part 10. As a result, the internal conductor part 10, at its first end 10.1, permits the contact-connection of the outer contact region 24*a* of the first circuit board 2, since it projects beyond the first through hole 11 and the feedthrough 25. For the representation of geometrical relationships, a broken auxiliary line has been plotted in FIG. 12.

Figure 13:
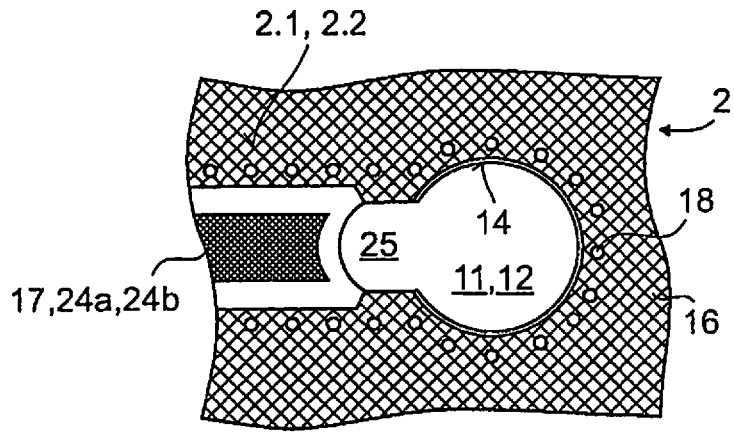
FIG. 13 shows a plan view of the first through hole and of the outer contact region of the first circuit board according to FIG. 12.

In the interests of further clarification, FIG. 13 shows a plan view of the first through hole 11 which is employed in the exemplary embodiment according to FIGS. 11 and 12.

Finally, FIGS. 14 to 18 show a further exemplary embodiment of the invention, wherein the internal conductor part 10, in an initial state, is entirely arranged within the exterior housing 9 of the connection element 8. The first circuit board 2, at the inner side 2.2 which faces the second circuit board 3, incorporates an inner contact region 24*b* for the contact-connection of the second electrical path or of the first end 10.1 of the internal conductor part 10 of the connection element 8. The second circuit board 3, at the inner side 3.2 which faces the first circuit board 2, likewise incorporates an inner contact region 24*b* for the contact-connection of the second electrical path or of the second end 10.2 of the internal conductor part 10 of the connection element 8. The exterior housing 9 is contact-connected, as previously, within the first through hole 11 and also within the second through hole 12.

Figure 14:
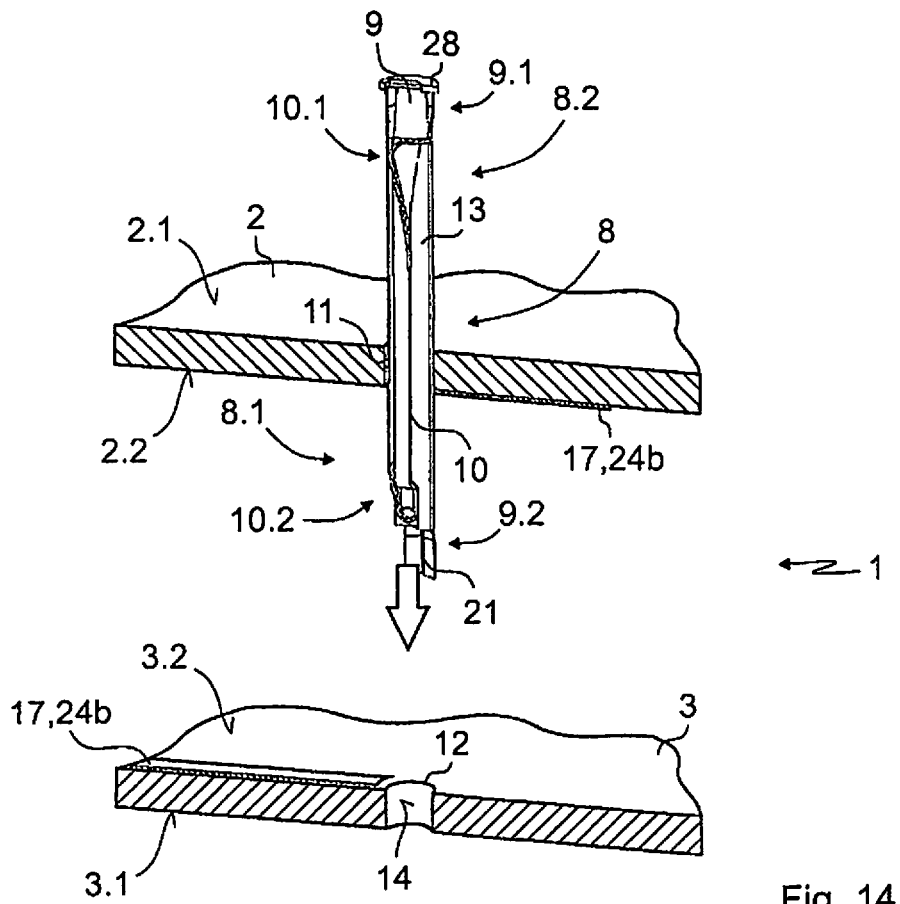
FIG. 14 shows a method for assembling a connection element according to a seventh embodiment in a circuit board arrangement, during a first assembly step.

FIG. 14 shows an isometric representation in a partial sectional view, wherein the assembly of the connection element 8 during a first step is represented, whereby the connection element 8, at its front end 8.1, is firstly fed through the first through hole 11, and thereafter through the interspace between the first circuit board 2 and the second circuit board 3.

Figure 15:
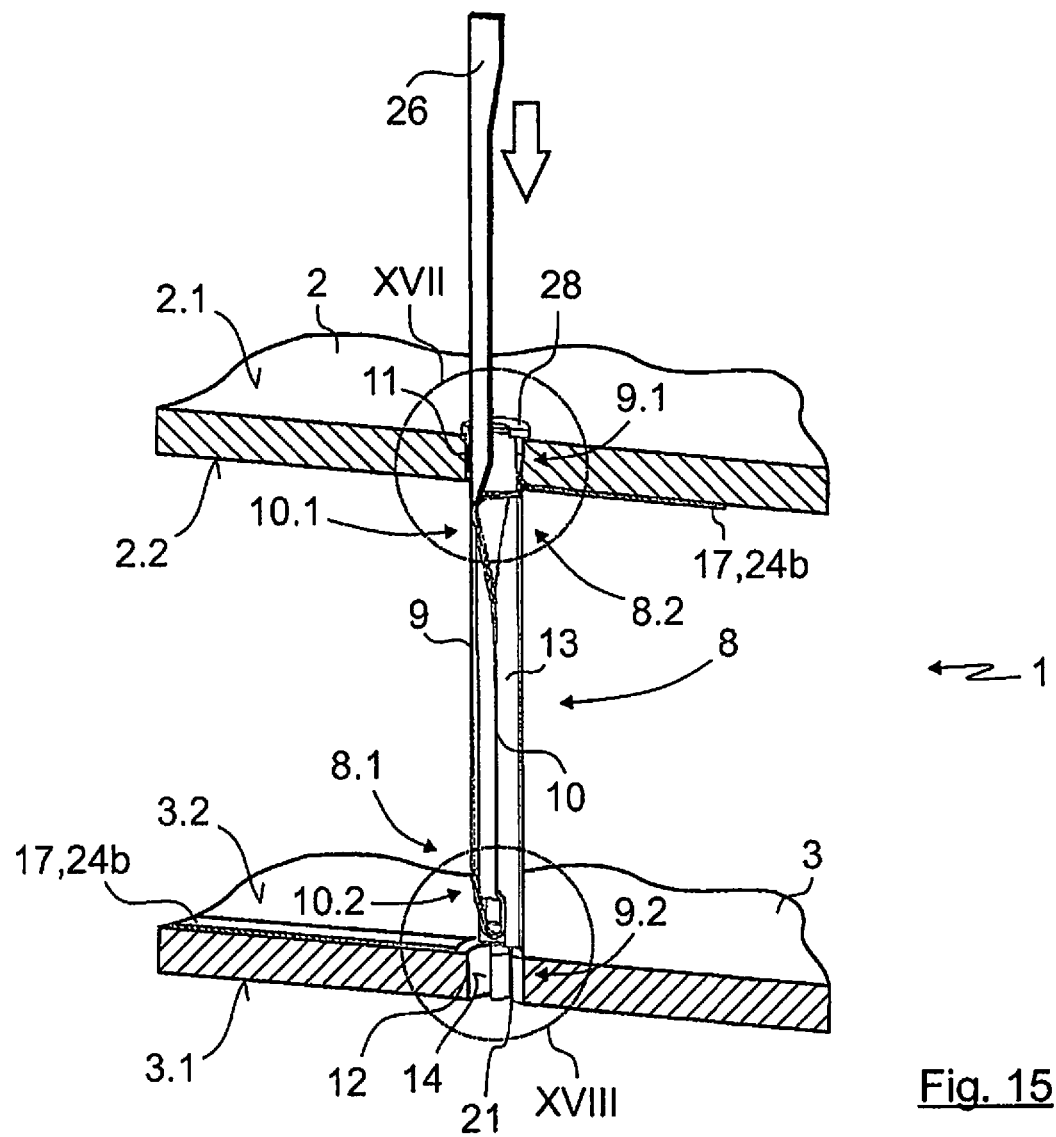
FIG. 15 shows the method according to FIG. 14 during a second assembly step, with the employment of a clamping wedge.

In FIG. 15, the connection element 8 is already located in its terminal position, wherein the exterior housing 9 is electrically contact-connected with both circuit boards 2, 3, in order to constitute the first electrical path. With respect to the preceding embodiments, assembly would already be completed at this point, as the internal conductor part 10 and thus the second electrical path would already be connected to the circuit boards 2, 3. In the present case, however, the internal conductor part 10 is still located in its initial position within the exterior housing 9.

In this embodiment, only one clamping wedge 26 is provided, which can be inserted into the exterior housing 9 of the connection element 8 and is configured to bend out the internal conductor part 10, in the region of at least one of its two ends 10.1, 10.2, preferably in the region of both ends 10.1, 10.2, through the cutouts 19 in the exterior housing 9, in order to contact-connect the inner contact regions 24*b* of the circuit boards 2, 3. In FIG. 15, this second assembly step is represented in an exemplary manner, wherein the clamping wedge 26, starting from the first end 9.1 of the exterior housing 9 of the connection element 8, is pushed through the connection element 8, in order to bend the internal conductor part 10. In principle, however, the internal conductor part 10 can also be bendable in any other way. In particular, the employment of a clamping wedge 26 is not absolutely necessary.

Figure 16:
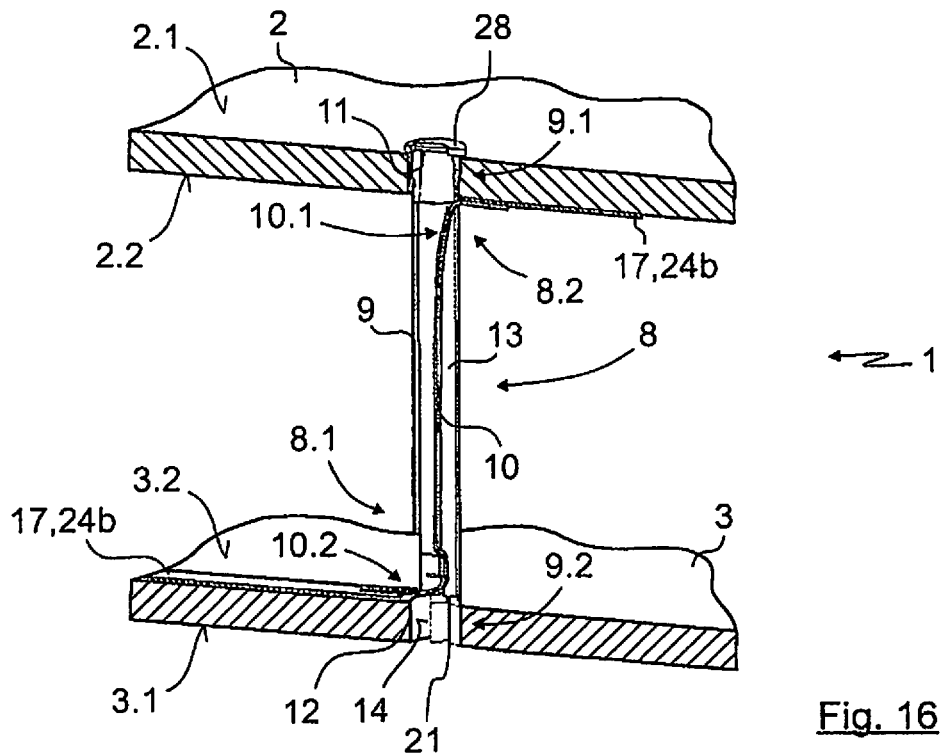
FIG. 16 shows the circuit board arrangement according to FIGS. 14 and 15, after the assembly of the connection element.

Finally, FIG. 16 shows the connection element 8 in its terminal position, with bent-out ends 10.1, 10.2 of the internal conductor part 10. In FIG. 16, the clamping wedge 26 is no longer represented. After bending, the clamping wedge 26 remains in the exterior housing 9.

Figure 17:
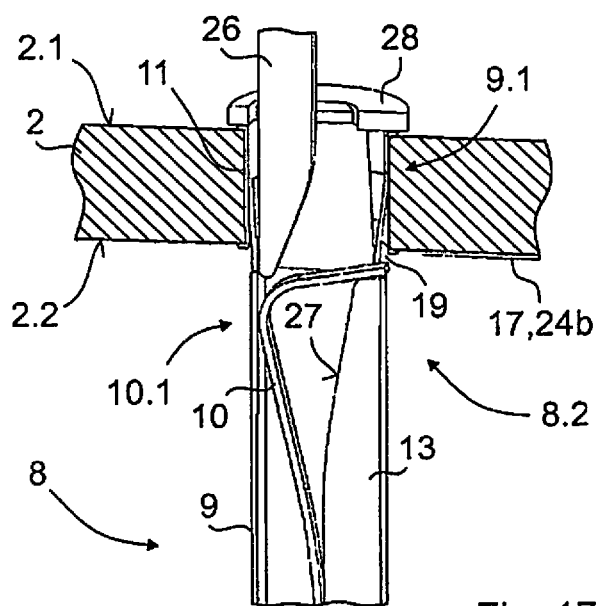
FIG. 17 shows an enlargement of section XVII from FIG. 15.

FIG. 17 shows an enlargement of section XVII from FIG. 15, wherein the first end 10.1 of the internal conductor part 10 is still located in its initial position, before it is laterally bent out of the exterior housing 9 by the clamping wedge 26.

Figure 18:
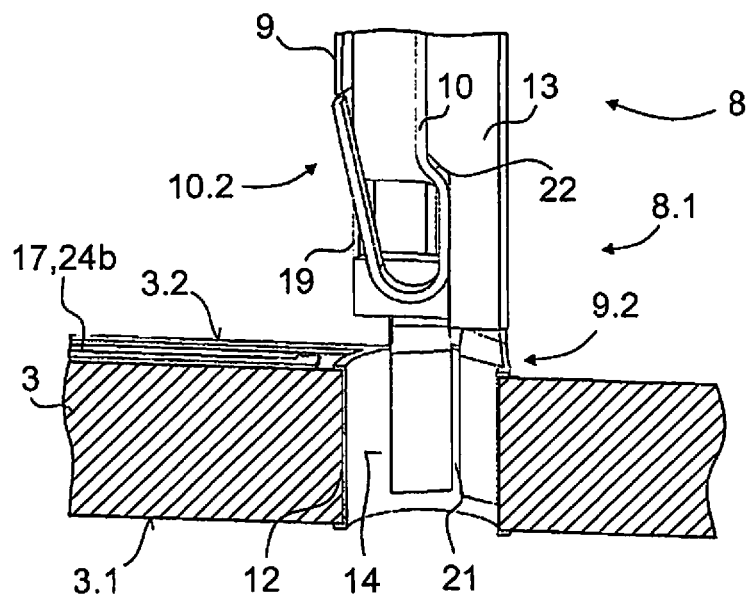
FIG. 18 shows an enlargement of section XVIII from FIG. 15.

FIG. 18 shows an enlargement of section XVIII from FIG. 15, wherein the internal conductor part 10 or the second end 10.2 of the internal conductor part 10 is still located in its initial position within the exterior housing 9, before it is laterally bent out of the exterior housing 9 by the clamping wedge 26.

Figure 19:
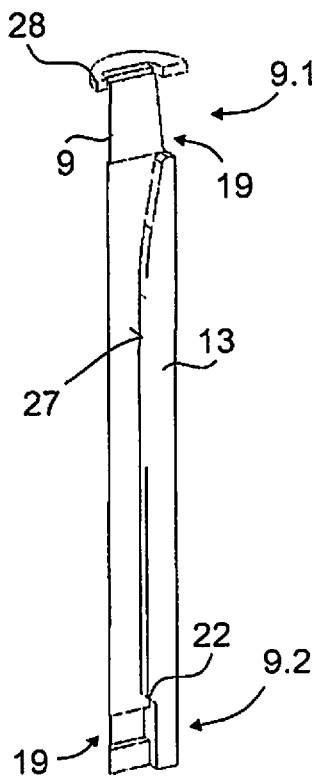
FIG. 19 shows a detailed representation of the exterior housing of the connection element according to FIG. 14.

FIG. 19 shows a detailed representation of the exterior housing 9 in an isometric partial section. The exterior housing 9 comprises an insulator 13 having a contact surface 27 for the internal conductor part 10, and a limit stop 28 in the region of the rear end 8.2 of the connection element 8.

In principle, the connection element 8, in the region of its front end 8.1 and/or in the region of its rear end 8.2, which is averted from the front end 8.1, can incorporate a limit stop 28, in order to obstruct axial movement of the connection element 8 in the plug-in direction beyond the terminal position by a form-fitted arrangement, wherein the limit stop 28 engages with the outer side 2.1 of the first circuit board 2 and/or with the inner side 3.2 of the second circuit board 3. In particular, in the exemplary embodiment according to FIG. 1, the limit stops 28 can also be clearly seen.

FIGS. 20 to 23 show two exemplary embodiments of an independent invention, wherein the connection element 8 is modified such that it can also be employed in a conventional sandwich structure of a circuit board arrangement 1.

In the first exemplary embodiment according to FIGS. 20 and 21, it is provided that the first circuit board 2, at the inner side 2.2 thereof which faces the second circuit board 3, incorporates an inner contact region 24b for the contact-connection of the first end 10.1 of the internal conductor part 10. Contact-connection of the connection element 8 in the region of the second circuit board 3, as described above, takes place entirely within the second through hole 12. The first through hole 12 further serves for the contact-connection of the first end 9.1 of the exterior housing 9.

For the assembly of the connection element 8, it is provided that, firstly, the connection element 8, at its front end 8.1, is inserted into the second through hole 12 of the second circuit board 3 until it achieves its terminal position, whereafter the first circuit board 2 is fitted onto the rear end 8.2 of the connection element 8, until the inner contact region 24b contact-connects the first end 10.1 of the internal conductor part 10, and both electrical paths are closed.

Figure 22:
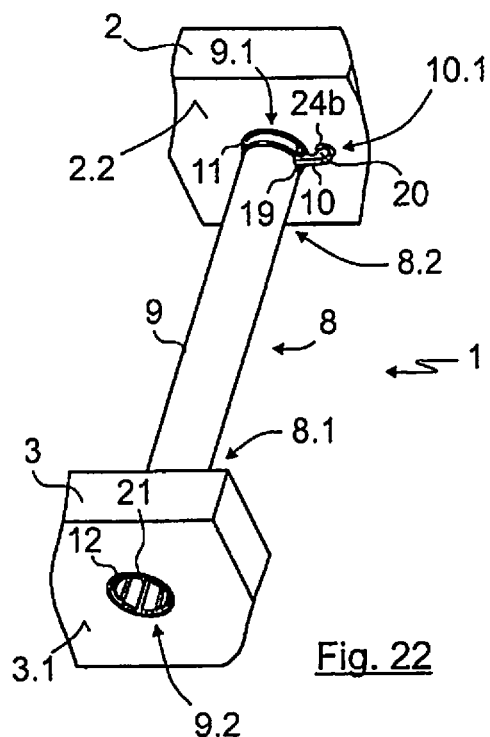
FIG. 22 shows a connection element in its terminal position between two circuit boards according to a second variant of the independent invention, in an isometric representation.
Figure 23:
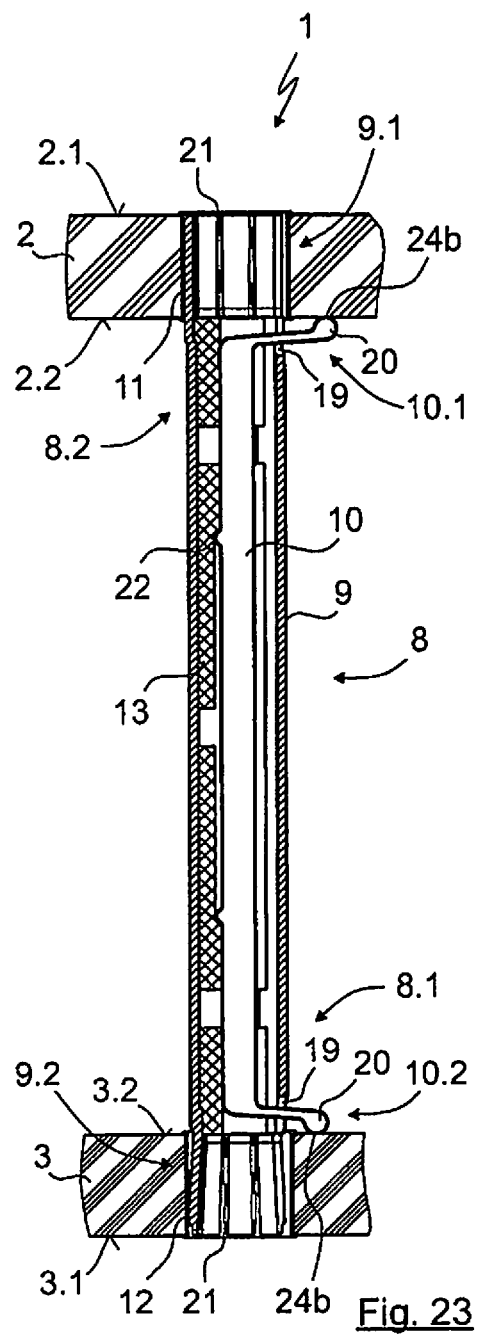
FIG. 23 shows the connection element according to FIG. 22, in a sectional representation.

A further embodiment of the independent invention is represented in FIGS. 22 and 23. The exemplary embodiment essentially corresponds to the exemplary embodiment according to FIGS. 20 and 21; the contact-connection has been modified just in the region of the second circuit board 3.

Correspondingly, in the region of the second circuit board 3, the second end 10.2 of the internal conductor part 10 is contact-connected by means of an inner contact surface 24 of the second circuit board 3. The first through hole 11 and the second through hole 12 thus serve only for contact-connection of the exterior housing 9, and for centering.

A circuit board arrangement 1, comprising at least one first circuit board 2 and a second circuit board 3, wherein the circuit boards 2, 3, 4 are arranged in a parallel orientation to one another in different planes, and wherein at least one rigid connection element 8 is arranged between the circuit boards 2, 3, 4, wherein the connection element 8 comprises an exterior housing 9, which encloses an internal conductor part 10 of the connection element 8, and wherein a first end 9.1 of the exterior housing 9 is connected to the first circuit board 2 and a second end 9.2 of the exterior housing 9 is connected to the second circuit board 3, in an electrically conductive manner, to constitute a first electrical path, and wherein a first end 10.1 of the internal conductor part 10 is connected to the first circuit board 2 and a second end 10.2 of the internal conductor part 10 is connected to the second circuit board 3, in an electrically conductive manner, to constitute a second electrical path, characterized in that the first circuit board 2 comprises a first through hole 11, wherein the first through hole 11 and the connection element 8 are configured such that the connection element 8 is insertable into the first through hole 11 from an outer side 2.1 of the first circuit board 2 which is averted from the second circuit board 3, wherein a front end 8.1 of the connection element 8 which is fed through the first through hole 11, in a terminal position of the connection element 8, is contact-connected with the second circuit board 3 and the connection element 8 constitutes the electrical paths.

A circuit board arrangement 1 characterized in that the second circuit board 3 comprises a second through hole 12, wherein the second through hole 12 and the connection element 8 are configured such that the front end 8.1 of the connection element 8 is accommodated by the second through hole 12, when the connection element 8 is located in the terminal position.

A circuit board arrangement 1 characterized in that the first through hole 11 and/or the second through hole 12, on the inner surface, respectively comprise at least one electrical contact surface 14 for the constitution of the first electrical path and/or of the second electrical path.

A circuit board arrangement 1 characterized in that the first circuit board 2, on the outer side 2.1 which is averted from the second circuit board 3, incorporates an outer contact region 24a or, on an inner side 2.2 which faces the second circuit board 3, incorporates an inner contact region 24b for the contact-connection of the second electrical path of the connection element 8 and/or in that the second circuit board 3, on an outer side 3.1 which is averted from the first circuit board 2, incorporates an outer contact region 24a or, on an inner side 3.2 which faces the first circuit board 2, incorporates an inner contact region 24b for the contact-connection of the second electrical path of the connection element 8.

A circuit board arrangement 1, characterized in that a supporting structure 7 is provided, which secures the circuit boards 2, 3, 4 and positions them in relation to one another.

A circuit board arrangement 1, characterized in that the exterior housing 9 of the connection element 8, at least in the region between the circuit boards 2, 3, 4, is configured in an electrically conductive manner and encloses the internal conductor part 10 such that the internal conductor part 10 is electromagnetically shielded.

A circuit board arrangement 1, characterized in that the exterior housing 9 of the connection element 8, in the region of at least one of its two ends 9.1, 9.2, incorporates a cutout 19, in order to provide access to the internal conductor part 10 for the electrical contact-connection thereof and/or in order to bring the internal conductor part 10 out of the exterior housing 9 for the electrical contact-connection thereof.

A circuit board arrangement 1, characterized in that an insulator 13 is provided within the exterior housing 9 of the connection element 8, in order to electrically insulate the exterior housing 9 and the internal conductor part 10 from one another and/or to radially and/or axially secure the internal conductor part 10 in the exterior housing 9.

A circuit board arrangement 1, characterized in that the first through hole 11 has a larger diameter (B) than the second through hole 12, and/or the first end 9.1 of the exterior housing 9 has a larger diameter (C) than the second end 9.2 of the exterior housing 9.

A circuit board arrangement 1, characterized in that a press-fit arrangement is provided for the accommodation of the exterior housing 9 of the connection element 8 and/or of the internal conductor part in the first through hole 11 and/or in the second through hole 12.

A circuit board arrangement 1, characterized in that the connection element 8, in the region of its front end 8.1 and/or in the region of its rear end 8.2, which is averted from the front end 8.1, incorporates a limit stop 28, in order to obstruct axial movement of the connection element 8 beyond the terminal position by a form-fitted arrangement, wherein the limit stop 28 engages with the outer side 2.1 of the first circuit board 2 and/or with the inner side 3.2 of the second circuit board 3.

A circuit board arrangement 1, characterized in that the first through hole 11 and/or the second through hole 12 comprise(s) two mutually electrically insulated contact surfaces 14, in order to electrically connect both the exterior housing 9 and the internal conductor part 10 to the circuit board 2, 3 within the through hole 11, 12.

A circuit board arrangement 1, characterized in that the internal conductor part 10, in the region of its first end 10.1, projects out of the exterior housing 9, in order to contact-connect the outer contact region 24a of the first circuit board 2, when the connection element 8 is located in its terminal position.

A circuit board arrangement 1, characterized in that the internal conductor part 10, in the region of its second end 10.2, projects laterally out of the exterior housing 9, in order to contact-connect the inner contact surface 24b of the second circuit board 2, when the connection element 8 is located in its terminal position, wherein the first through hole 11 incorporates a feedthrough 25 in order to permit the passage of the laterally projecting internal conductor part 10 during the routing of the connection element 8 through the first through hole 11.

A circuit board arrangement 1, characterized in that the internal conductor part 10, in an initial state, is entirely arranged within the exterior housing 9 of the connection element 8, wherein at least one clamping wedge 26 is provided, which can be inserted into the exterior housing 9 of the connection element 8, and is configured such that the internal conductor part 10, in the region of at least one of its two ends 10.1, 10.2, preferably in the region of both ends 10.1, 10.2, is bent out through the cutouts 19 in the exterior housing 9, in order to contact-connect the inner contact region 24b of at least one of the circuit boards 2, 3, 4.

A circuit board arrangement 1, characterized in that the internal conductor part 10, in the region of at least one of its two ends 10.1, 10.2, is configured elastically or resiliently, in order to permit a mechanically stable electrical contact-connection with the circuit board 2, 3, 4.

A connection element 8 for a circuit board arrangement 1.

A connection element 8 for a circuit board arrangement 1 wherein the connection element 8 comprises an exterior housing 9 which encloses an internal conductor part 10 of the connection element 8, and wherein a first end 9.1 of the exterior housing 9 can be connected to the first circuit board 2 and a second end 9.2 of the exterior housing 9 can be connected to the second circuit board 3, in an electrically conductive manner, to constitute a first electrical path, and wherein a first end 10.1 of the internal conductor part 10 can be connected to the first circuit board 2 and a second end 10.2 of the internal conductor part 10 can be connected to the second circuit board 3, in an electrically conductive manner, to constitute a second electrical path, and wherein the connection element 8 is configured such that the connection element 8 is insertable into the first through hole 11 of the first circuit board 2 from an outer side 2.1 of the first circuit board 2 which is averted from the second circuit board 3, wherein a front end 8.1 of the connection element 8 which is fed through the first through hole 11, in a terminal position of the connection element 8, is contact connected with the second circuit board 3 and the connection element 8 constitutes the electrical paths.

A method for assembling at least one connection element 8 in a preassembled circuit board arrangement 1 comprising at least one first circuit board 2 and a second circuit board 3, which are arranged in a parallel orientation to one another in different planes, wherein the connection element 8 comprises an exterior housing 9, which encloses an internal conductor part 10 of the connection element 8, and wherein a first end 9.1 of the exterior housing 9 is connected to the first circuit board 2 and a second end 9.2 of the exterior housing 9 is connected to the second circuit board 3, in an electrically conductive manner, to constitute a first electrical path, and wherein a first end 10.1 of the internal conductor part 10 is connected to the first circuit board 2 and a second end 10.2 of the internal conductor part 10 is connected to the second circuit board 3, in an electrically conductive manner, to constitute a second electrical path, characterized in that the connection element 8, for the assembly thereof between the circuit boards 2, 3, 4, is inserted from an outer side 2.1 of the first circuit board 2, which is averted from the second circuit board 3, into a first through hole 11, until the connection element 8 achieves a terminal position in the circuit board arrangement 1, in which a front end 8.1 of the connection element 8 which is fed through the first through hole 11 contact-connects the second circuit board 3, and the connection element 8 constitutes the electrical paths.

A method, characterized in that in a second assembly step, the internal conductor part 10, in the region of at least one of its two ends 10.1, 10.2, is bent out through a cutout 19 in the exterior housing 9, such that the internal conductor part 10 contact-connects a contact region 24a, 24b on an outer side 2.1, 3.1 or an inner side 2.2, 3.2 of at least one of the two circuit boards 2, 3.

A method, characterized in that at least one clamping wedge 26 is employed which, starting from the first end 9.1 and/or the second end 9.2 of the exterior housing 9 of the connection element 8, is inserted into the connection element 8, in order to bend the internal conductor part 10.

A circuit board arrangement comprising: a first circuit board 2 and a second circuit board 3, and wherein the first and second circuit boards 2, 3, 4 are arranged in a parallel orientation to one another in different planes, and wherein at least one rigid connection element 8 is arranged between the first and the second circuit boards 2, 3, 4, and wherein the at least one rigid connection element 8 has an exterior housing 9, which encloses an internal conductor part 10 of the at least one rigid connection element 8, and wherein a first end 9.1 of the exterior housing 9 is connected to the first circuit board 2 and a second end 9.2 of the exterior housing 9 is connected to the second circuit board 3, in an electrically conductive manner, to constitute a first electrical path, and wherein a first end 10.1 of the internal conductor part 10 is connected to the first circuit board 2 and a second end 10.2 of the internal conductor part 10 is connected to the second circuit board 3, in an electrically conductive manner, to constitute a second electrical path: and the first circuit board 2 defines a first through hole 11, wherein the first through hole 11 and the at least one rigid connection element 8 are configured such that the at least one rigid connection element 8 is insertable into the first through hole 11 from an outer side 2.1 of the first circuit board 2 which is averted from the second circuit board 3, and wherein a front end 8.1 of the at least one rigid connection element 8 which is fed through the first through hole 11, in a terminal position of the at least one rigid connection element 8, is contact-connected with the second circuit board 3 and the at least one rigid connection element 8 constitutes the electrical paths.

The circuit board arrangement 1, and wherein the second circuit board 3 defines a second through hole 12, and wherein the second through hole 12 and the at least one rigid connection element 8 are configured such that the front end

8.1 of the at least one rigid connection element 8 is accommodated by the second through hole 12, when the at least one rigid connection element 8 is located in the terminal position.

The circuit board arrangement 1 and further comprising: at least one electrical contact surface on the inner surface of the first through hole and/or on the inner surface of the second through hole, and the at least one electrical contact surface provides the electrical path.

The circuit board arrangement 1 and further comprising: an outer contact region on the first circuit board on an outer side that is averted from the second circuit board, or an inner contact region on the first circuit board on an inner side which faces the second circuit board for the contact-connection for the second electrical path of the at least one rigid connection element.

The circuit board arrangement 1 and further comprising: a supporting structure 7 which positionally secures the first and second circuit boards in relation to one another.

The circuit board arrangement 1 and wherein the exterior housing 9 of the at least one rigid connection element 8, at least in the region between the first and second circuit boards 2, 3, 4, is configured in an electrically conductive manner and encloses the internal conductor part 10 such that the internal conductor part 10 is electromagnetically shielded.

The circuit board arrangement 1 and wherein the exterior housing 9 of the at least one rigid connection element 8, in a region adjacent at least one of its two ends 9.1, 9.2, defines a cutout 19 to provide access to the internal conductor part 10 for the electrical contact-connection thereof to bring the internal conductor part 10 out of the exterior housing 9 for the electrical contact-connection thereof.

The circuit board arrangement 1 and further comprising an insulator 13 within the exterior housing 9 of the at least one rigid connection element 8 to electrically insulate the exterior housing 9 and the internal conductor part 10 from one another and to secure the internal conductor part within 10 in the exterior housing 9.

The circuit board arrangement 1 and wherein the first through hole 11 has a diameter that is larger than a diameter of the second through hole 12; and the first end 9.1 of the exterior housing 9 of the at least one rigid connection element has a diameter that is larger than a diameter of the second end 9.2 of the exterior housing 9.

The circuit board arrangement wherein a press-fit arrangement is provided for accommodation of the exterior housing 9 of the at least one rigid connection element 8 and/or of the internal conductor part in the first through hole 11.

The circuit board arrangement 1 further comprising: a limit stop on the at least one rigid connection element in a region proximate an end of the at least one rigid connection element to obstruct axial movement of the at least one rigid connection element 8 beyond the terminal position by a form-fitted arrangement, and wherein the limit stop 28 engages with the outer side 2.1 of the first circuit board 2 and/or with the inner side 3.2 of the second circuit board 3.

The circuit board arrangement 1 and wherein at least one through hole 11, 12 has two mutually electrically insulated contact surfaces 14, in order to electrically connect both the exterior housing 9 and the internal conductor part 10 to the circuit board 2, 3 within the through hole 11, 12.

The circuit board arrangement 1 wherein the internal conductor part 10, in the region of its first end 10.1, projects out of the exterior housing 9, in order to contact-connect the outer contact region 24a of the first circuit board 2, when the at least one rigid connection element 8 is in its terminal position.

The circuit board arrangement 1 wherein the internal conductor part 10, in the region of its second end 10.2, projects laterally out of the exterior housing 9, to contact-connect the inner contact surface 24b of the second circuit board 2, when the at least one rigid connection element 8 is located in its terminal position, and wherein the first through hole 11 incorporates a feedthrough 25 in order to permit the passage of the laterally outwardly projecting internal conductor part 10 during the routing of the at least one rigid connection element 8 through the first through hole 11.

The circuit board arrangement further comprising: a clamping wedge 26 for insertion into the exterior housing 9 of the at least one rigid connection element 8, and the clamping wedge is configured such that the internal conductor part 10 at an end portion thereof, is bent out through a cutout 19 defined in the exterior housing 9, in order to contact-connect the inner contact region 24b of at least one of the circuit boards 2, 3, 4.

The circuit board arrangement wherein the internal conductor part 10, in the region of at least one of its two ends 10.1, 10.2, is configured elastically or resiliently, in order to permit a mechanically stable electrical contact-connection with the circuit board 2, 3, 4.

A connection element 8 for a circuit board arrangement and wherein the at least one rigid connection element 8 has an exterior housing 9 which encloses an internal conductor part 10, and wherein a first end 9.1 of the exterior housing 9 can be connected to the first circuit board 2 and a second end 9.2 of the exterior housing 9 can be connected to the second circuit board 3, in an electrically conductive manner, to constitute a first electrical path; and wherein a first end 10.1 of the internal conductor part 10 can be connected to the first circuit board 2 and a second end 10.2 of the internal conductor part 10 can be connected to the second circuit board 3, in an electrically conductive manner, to constitute a second electrical path; and wherein the at least one rigid connection element 8 is configured such that the at least one rigid connection element 8 is insertable into, and at least partially through, the first through hole 11 defined by the first circuit board 2 from an outer side 2.1 of the first circuit board 2 which is averted from the second circuit board 3; and wherein a front end 8.1 of the at least one rigid connection element 8 which is fed through the first through hole 11, in a terminal position of the at least one rigid connection element 8, is contact connected with the second circuit board 3; and the at least one rigid connection element 8 constitutes the electrical paths.

A method for assembling at least one connection element 8 in a preassembled circuit board arrangement 1, the method comprising: a first circuit board 2 and a second circuit board 3, and the first and second circuit boards are arranged in a parallel orientation to one another in different planes; a connection element 8 having an exterior housing 9, which encloses an internal conductor part 10 of the connection element 8, and wherein a first end 9.1 of the exterior housing 9 is connected to the first circuit board 2 and a second end 9.2 of the exterior housing 9 is connected to the second circuit board 3, in an electrically conductive manner, to constitute a first electrical path; and a first end 10.1 of the internal conductor part 10 is connected to the first circuit board 2 and a second end 10.2 of the internal conductor part 10 is connected to the second circuit board 3, in an electrically conductive manner, to constitute a second electrical path; and wherein the connection element 8, for the assembly thereof, between the first and second circuit boards 2, 3, 4, is inserted from an outer side 2.1 of the first circuit board 2, which is averted from the second circuit board 3, into and through a first through hole 11, until the connection element 8 achieves a terminal position in the circuit board arrangement 1, in which a front end 8.1 of the connection element 8 which is fed through the first through hole 11 contact-connects the second circuit board 3, and the connection element 8 constitutes the electrical paths.

The method further comprising: a second assembly step, wherein the internal conductor part 10, in the region of at least one of its two ends 10.1, 10.2, is bent out through a cutout 19 defined in the exterior housing 9, such that the internal conductor part 10 contact-connects a contact region 24*a*, 24*b* on an outer side 2.1, 3.1 or an inner side 2.2, 3.2 of at least one of the two circuit boards 2, 3.

The method further comprising the step: inserting a clamping wedge in the exterior housing of the connection element, starting from the first end 9.1 and/or the second end 9.2 to bend the internal conductor part 10.

The circuit board arrangement further comprising: an outer contact region on the second circuit board on an outer side that is averted from the first circuit board, or an inner contact region on the second circuit board on an inner side which faces the first circuit board for the contact-connection for the second electrical path of the at least one rigid connection element.

The circuit board arrangement further comprising an insulator within the exterior housing of the at least one rigid connection element to secure the internal conductor part within the exterior housing.

The circuit board arrangement wherein a press-fit arrangement is provided for accommodation of the exterior housing of the at least one rigid connection element and/or of the internal conductor part in the second through hole.

Having thusly described our Circuit Board Arrangement, Connection Element and Method for Assembling at least one Connection Element, we file this US National Stage patent application and request issuance of Utility Letters Patent.

The invention claimed is:

1. A circuit board arrangement, comprising:
   a first circuit board and a second circuit board, and wherein the first and second circuit boards are arranged in a parallel orientation to one another in different planes, and wherein at least one rigid connection element is arranged between the first and the second circuit boards, and wherein the at least one rigid connection element has an exterior housing, which encloses an internal conductor part of the at least one rigid connection element, and wherein a first end of the exterior housing is connected to the first circuit board and a second end of the exterior housing is connected to the second circuit board, in an electrically conductive manner, to constitute a first electrical path, and wherein a first end of the internal conductor part is connected to the first circuit board and a second end of the internal conductor part is connected to the second circuit board, in an electrically conductive manner, to constitute a second electrical path; and
   the first circuit board defines a first through hole, wherein the first through hole and the at least one rigid connection element are configured such that the at least one rigid connection element is insertable into the first through hole from an outer side of the first circuit board which is averted from the second circuit board, and wherein a front end of the at least one rigid connection element which is fed through the first through hole, in a terminal position of the at least one rigid connection element, is contact-connected with the second circuit board and the at least one rigid connection element constitutes the electrical paths.

2. The circuit board arrangement as claimed in claim 1, and wherein the second circuit board defines a second through hole, and wherein the second through hole and the at least one rigid connection element are configured such that the front end of the at least one rigid connection element is accommodated by the second through hole, when the at least one rigid connection element is located in the terminal position.

3. The circuit board arrangement as claimed in claim 2 and further comprising:
   at least one electrical contact surface on the inner surface of the first through hole and/or on the inner surface of the second through hole, and the at least one electrical contact surface provides the electrical path.

4. The circuit board arrangement as claimed in claim 1 and further comprising:
   an outer contact region on the first circuit board on an outer side that is averted from the second circuit board, or an inner contact region on the first circuit board on an inner side which faces the second circuit board for the contact-connection for the second electrical path of the at least one rigid connection element.

5. The circuit board arrangement as claimed in claim 1 and further comprising:
   a supporting structure, which positionally secures the first and second circuit boards in relation to one another.

6. The circuit board arrangement as claimed in claim 1 and wherein the exterior housing of the at least one rigid connection element, at least in the region between the first and second circuit boards, is configured in an electrically conductive manner and encloses the internal conductor part such that the internal conductor part is electromagnetically shielded.

7. The circuit board arrangement (1) as claimed in claim 1 and wherein the exterior housing of the at least one rigid connection element, in a region adjacent at least one of its two ends, defines a cutout to provide access to the internal conductor part for the electrical contact-connection thereof to bring the internal conductor part out of the exterior housing for the electrical contact-connection thereof.

8. The circuit board arrangement as claimed in claim 1 and further comprising:
   an insulator within the exterior housing of the at least one rigid connection element to electrically insulate the exterior housing and the internal conductor part from one another and to secure the internal conductor part within the exterior housing.

9. The circuit board arrangement as claimed in claim 2 and wherein the first through hole has a diameter that is larger than a diameter of the second through hole; and
   the first end of the exterior housing of the at least one rigid connection element has a diameter that is larger than a diameter of the second end of the exterior housing.

10. The circuit board arrangement as claimed in claim 9 and wherein a press-fit arrangement is provided for accommodation of the exterior housing of the at least one rigid connection element and/or of the internal conductor part in the first through hole.

11. The circuit board arrangement as claimed in claim 1 and further comprising:
   a limit stop on the at least one rigid connection element in a region proximate an end of the at least one rigid connection element to obstruct axial movement of the at least one rigid connection element beyond the terminal position by a form-fitted arrangement, and wherein the limit stop engages with the outer side of the first circuit board and/or with the inner side of the second circuit board.

12. The circuit board arrangement as claimed in claim 2 and wherein at least one through hole has two mutually electrically insulated contact surfaces, in order to electrically connect both the exterior housing and the internal conductor part to the circuit board within the through hole.

13. The circuit board arrangement as claimed in claim 4 and wherein the internal conductor part, in the region of its first end, projects out of the exterior housing (9), in order to contact-connect the outer contact region of the first circuit board, when the at least one rigid connection element is in its terminal position.

14. The circuit board arrangement as claimed in claim 4 and wherein the internal conductor part, in the region of its second end, projects laterally out of the exterior housing to contact-connect the inner contact surface of the second circuit board, when the at least one rigid connection element is located in its terminal position, and wherein the first through hole incorporates a feedthrough in order to permit the passage of the laterally outwardly projecting internal conductor part during the routing of the at least one rigid connection element through the first through hole.

15. The circuit board arrangement as claimed in claim 4 and further comprising:
a clamping wedge for insertion into the exterior housing of the at least one rigid connection element, and the clamping wedge is configured such that the internal conductor part at an end portion thereof, is bent out through a cutout defined in the exterior housing, in order to contact-connect the inner contact region of at least one of the circuit boards.

16. The circuit board arrangement as claimed in claim 1 and wherein the internal conductor part, in the region of at least one of its two ends, is configured resiliently, in order to permit a mechanically stable electrical contact-connection with the circuit board.

17. A connection element for a circuit board arrangement as claimed in claim 1 and wherein the at least one rigid connection element has an exterior housing which encloses an internal conductor part, and wherein a first end of the exterior housing can be connected to the first circuit board and a second end of the exterior housing can be connected to the second circuit board, in an electrically conductive manner, to constitute a first electrical path; and wherein
a first end of the internal conductor part can be connected to the first circuit board and a second end of the internal conductor part can be connected to the second circuit board, in an electrically conductive manner, to constitute a second electrical path; and wherein
the at least one rigid connection element is configured such that the at least one rigid connection element is insertable into, and at least partially through, the first through hole defined by the first circuit board from an outer side of the first circuit board which is averted from the second circuit board; and wherein
a front end of the at least one rigid connection element which is fed through the first through hole, in a terminal position of the at least one rigid connection element, is contact connected with the second circuit board; and
the at least one rigid connection element constitutes the electrical paths.

18. A method for assembling at least one connection element in a preassembled circuit board arrangement, the method comprising:
a first circuit board and a second circuit board and the first and second circuit boards are arranged in a parallel orientation to one another in different planes;
a connection element having an exterior housing, which encloses an internal conductor part of the connection element, and wherein a first end of the exterior housing is connected to the first circuit board and a second end of the exterior housing is connected to the second circuit board, in an electrically conductive manner, to constitute a first electrical path; and
a first end of the internal conductor part is connected to the first circuit board and a second end of the internal conductor part is connected to the second circuit board, in an electrically conductive manner, to constitute a second electrical path;
and wherein the connection element, for the assembly thereof, between the first and second circuit boards, is inserted from an outer side of the first circuit board, which is averted from the second circuit board, into and through a first through hole, until the connection element achieves a terminal position in the circuit board arrangement, in which a front end of the connection element which is fed through the first through hole contact-connects the second circuit board, and the connection element constitutes the electrical paths.

19. The method as claimed in claim 18, and further comprising:
a second assembly step, wherein the internal conductor part, in the region of at least one of its two ends, is bent out through a cutout defined in the exterior housing, such that the internal conductor part contact-connects a contact region of at least one of the circuit boards.

20. The method as claimed in claim 19, and further comprising the step:
inserting a clamping wedge in the exterior housing of the connection element, starting from the first end and/or the second end to bend the internal conductor part.

21. The circuit board arrangement as claimed in claim 1 and further comprising:
an outer contact region on the second circuit board on an outer side that is averted from the first circuit board, or an inner contact region on the second circuit board on an inner side which faces the first circuit board for the contact-connection for the second electrical path of the at least one rigid connection element.

22. The circuit board arrangement as claimed in claim 1 and further comprising:
an insulator within the exterior housing of the at least one rigid connection element to secure the internal conductor part within the exterior housing.

23. The circuit board arrangement as claimed in claim 9 and wherein a press-fit arrangement is provided for accommodation of the exterior housing of the at least one rigid connection element and/or of the internal conductor part in the second through hole.

* * * * *